US007010769B2

(12) United States Patent
McElvain et al.

(10) Patent No.: US 7,010,769 B2
(45) Date of Patent: *Mar. 7, 2006

(54) METHODS AND APPARATUSES FOR DESIGNING INTEGRATED CIRCUITS

(75) Inventors: Kenneth S. McElvain, Los Altos, CA (US); Robert Erickson, Cupertino, CA (US)

(73) Assignee: Synplicity, Inc., Sunnyvale, CA (US)

( * ) Notice: Subject to any disclaimer, the term of this patent is extended or adjusted under 35 U.S.C. 154(b) by 457 days.

This patent is subject to a terminal disclaimer.

(21) Appl. No.: 10/313,523

(22) Filed: Dec. 5, 2002

(65) Prior Publication Data

US 2003/0079195 A1    Apr. 24, 2003

Related U.S. Application Data

(63) Continuation of application No. 09/313,225, filed on May 17, 1999, now Pat. No. 6,519,754.

(51) Int. Cl.
    G06F 17/50    (2006.01)
(52) U.S. Cl. .............................. 716/9; 716/10; 716/16; 716/18; 716/7
(58) Field of Classification Search ................ 716/9, 716/10, 16, 18, 7
See application file for complete search history.

(56) References Cited

U.S. PATENT DOCUMENTS

| 5,396,435 | A | * | 3/1995 | Ginetti ........................... 716/6 |
| 5,475,830 | A | * | 12/1995 | Chen et al. ..................... 716/16 |
| 5,550,839 | A | * | 8/1996 | Buch et al. ................... 714/724 |
| 5,696,693 | A | * | 12/1997 | Aubel et al. .................... 716/8 |
| 5,696,771 | A | * | 12/1997 | Beausang et al. ............ 714/726 |
| 5,831,866 | A | * | 11/1998 | Burgun et al. ................... 716/6 |
| 5,835,751 | A | * | 11/1998 | Chen et al. ..................... 716/16 |
| 5,867,396 | A | * | 2/1999 | Parlour ......................... 716/18 |
| 5,896,299 | A | * | 4/1999 | Ginetti et al. ................... 716/4 |
| 5,903,466 | A | * | 5/1999 | Beausang et al. .............. 716/18 |
| 6,011,911 | A | * | 1/2000 | Ho et al. ......................... 716/5 |
| 6,026,226 | A | * | 2/2000 | Heile et al. .................... 716/12 |
| 6,080,201 | A | * | 6/2000 | Hojat et al. .................... 703/14 |
| 6,135,647 | A | | 10/2000 | Balakrishnan et al. |
| 6,141,631 | A | | 10/2000 | Blinne et al. |
| 6,145,117 | A | * | 11/2000 | Eng .............................. 716/18 |
| 6,192,504 | B1 | * | 2/2001 | Pfluger et al. ................. 716/1 |
| 6,205,572 | B1 | * | 3/2001 | Dupenloup ..................... 716/5 |
| 6,216,252 | B1 | * | 4/2001 | Dangelo et al. ................ 716/1 |
| 6,216,258 | B1 | * | 4/2001 | Mohan et al. ................. 716/17 |

(Continued)

OTHER PUBLICATIONS

Wakabayashi et al., "Gate Array Placement based on Mincut Partitioning with Path Delay Constraints", 1993 IEEE International Symposium on Circuits and Systems, vol. 3, May 3, 1993, pp. 2059-2062.*

(Continued)

*Primary Examiner*—Matthew Smith
*Assistant Examiner*—Phallaka Kik
(74) *Attorney, Agent, or Firm*—Blakely, Sokoloff, Taylor & Zafman LLP

(57) ABSTRACT

Methods and apparatuses for designing an integrated circuit. In one example of a method, a hardware description language (HDL) code is compiled to produce a technology independent RTL (register transfer level) netlist. A portion of an area of the IC is allocated to a specific portion of the technology independent RTL netlist. In a typical implementation of this method, the allocation restricts circuitry created from the specific portion to the portion of the IC.

99 Claims, 24 Drawing Sheets

U.S. PATENT DOCUMENTS

| | | | |
|---|---|---|---|
| 6,243,851 B1 * | 6/2001 | Hwang et al. | 716/10 |
| 6,260,182 B1 * | 7/2001 | Mohan et al. | 716/12 |
| 6,286,128 B1 * | 9/2001 | Pileggi et al. | 716/18 |
| 6,292,925 B1 * | 9/2001 | Dellinger et al. | 716/8 |
| 6,301,553 B1 * | 10/2001 | Burgun et al. | 703/15 |
| 6,321,369 B1 * | 11/2001 | Heile et al. | 716/11 |
| 6,438,735 B1 * | 8/2002 | McElvain et al. | 716/7 |
| 6,457,164 B1 * | 9/2002 | Hwang et al. | 716/8 |
| 6,463,568 B1 * | 10/2002 | Wasson | 716/2 |
| 6,505,328 B1 * | 1/2003 | Van Ginneken et al. | 716/7 |
| 6,519,754 B1 * | 2/2003 | McElvain et al. | 716/18 |
| 6,629,296 B1 * | 9/2003 | Ganesan et al. | 716/5 |
| 6,668,364 B1 * | 12/2003 | McElvain et al. | 716/7 |
| 6,687,882 B1 * | 2/2004 | McElvain et al. | 716/3 |
| 6,711,729 B1 * | 3/2004 | McElvain et al. | 716/18 |
| 2001/0001881 A1 * | 5/2001 | Mohan et al. | 716/1 |
| 2002/0116885 A1 * | 8/2002 | van Ginneken | 716/1 |
| 2002/0166098 A1 * | 11/2002 | Chang et al. | 716/1 |
| 2002/0188922 A1 * | 12/2002 | Ginneken et al. | 716/18 |
| 2002/0194572 A1 * | 12/2002 | McElvain et al. | 716/1 |
| 2003/0079195 A1 * | 4/2003 | McElvain et al. | 716/8 |
| 2003/0149954 A1 * | 8/2003 | McElvain et al. | 716/18 |
| 2004/0117756 A1 * | 6/2004 | McElvain et al. | 716/18 |

OTHER PUBLICATIONS

Togawa et al., "A Performance-Oriented Circuit Partitioning Algorithm with Logic-Block Replication for Multi-FPGA Systems", IEEE Asia Pacific Conference on Circuits and Systems, Nov. 18, 1996, pp. 294-297.*

Sakouti et al., "Coherent Optimization Strategies for Multilevel Synthesis", Proceedings of European Conference on Design Automation with the European Even in ASIC Design, Feb. 22, 1993, pp. 378-385.*

Liu et al., "A Replication Cut for Two-Way Partitioning", IEEE Transactions on Computer-Aided Deisgn of Integrated Circuits and Systems, vol. 14, No. 5, pp. 623-630.*

Puri et al., "Logic Optimization by Output Phase Assignment in Dynamic Logic Synthesis", 1996 IEEE/ACM International Conference on Computer-Aided Design, Nov. 10, 1996, pp. 2-8.*

Hinsberger et al., "Optimal Technology Mapping for Single Output Cells", 1995 Proceedings of Fifth Great Lakes Symposium on VLSI, Mar. 16, 1995, pp. 14-19.*

* cited by examiner

```
module prep2_2 (DATA0, DATA1, DATA2, LDPRE, SEL, RST, CLK,LDCOMP);
output [7:0] DATA0;
input [7:0] DATA1, DATA2;
input LDPRE, SEL, RST, CLK, LDCOMP;
    wire [7:0] DATA0_internal;
        prep2_1 inst1 (CLK, RST, SEL, LDCOMP, LDPRE, DATA1, DATA2, DATA0_internal);
        prep2_1 inst2 (CLK, RST, SEL, LDCOMP, LDPRE, DATA0_internal, DATA2, DATA0);

endmodule
```
703

```
module prep2_1 (CLK, RST, SEL, LDCOMP, LDPRE, DATA1, DATA2, DATA0);
input CLK, RST, SEL, LDCOMP, LDPRE;
input [7:0] DATA1, DATA2;
output [7:0] DATA0;
reg [7:0] DATA0;
reg [7:0] highreg_output, lowreg_output; // internal registers wire compare_output = (DATA == lowreg_output); // comparator
wire [7:0] mux_output = SEL ? DATA1 : highreg_output; // mux // registers
always @ (posedge CLK or posedge RST)
begin
        if (RST) begin
                highreg_output = 0;
                lowreg_output = 0;
        end else begin
                if (LDPRE)
                    highreg_output = DATA2;
                if (LDCOMP)
                    lowreg_output = DATA2;
        end
end // counter
always @ (posedge CLK or posedge RST)
begin
        if (RST)
                DATA0 = 0;
        else if (compare_output) // load
                DATA0 = mux_output;
        else
                DATA0 = DATA0 + 1;
end endmodule
```
705

METHODS AND APPARATUSES FOR DESIGNING INTEGRATED CIRCUITS

This application is a continuation application of U.S. patent application Ser. No. 09/313,225, filed May 17, 1999 now U.S. Pat. No. 6,519,754.

FIELD OF THE INVENTION

The present invention relates generally to the field of designing integrated circuits, and more particularly to the design of integrated circuits through a synthesis process which begins with the use of a hardware description language.

BACKGROUND OF THE INVENTION

For the design of digital circuits on the scale of VLSI (very large scale integration) technology, designers often employ computer aided techniques. Standard languages such as Hardware Description Languages (HDLs) have been developed to describe digital circuits to aide in the design and simulation of complex digital circuits. Several hardware description languages, such as VHDL and Verilog, have evolved as industry standards. VHDL and Verilog are general purpose hardware description languages that allow definition of a hardware model at the gate level, the register transfer level (RTL) or the behavioral level using abstract data types. As device technology continues to advance, various product design tools have been developed to adapt HDLs for use with newer devices and design styles.

In designing an integrated circuit with an HDL code, the code is first written and then compiled by an HDL compiler. The HDL source code describes at some level the circuit elements, and the compiler produces an RTL netlist from this compilation. The RTL netlist is typically a technology independent netlist in that it is independent of the technology/architecture of a specific vendor's integrated circuit, such as field programmable gate arrays (FPGA). The RTL netlist corresponds to a schematic representation of circuit elements (as opposed to a behavioral representation). A mapping operation is then performed to convert from the technology independent RTL netlist to a technology specific netlist which can be used to create circuits in the vendor's technology/architecture. It is well known that FPGA vendors utilize different technology/architecture to implement logic circuits within their integrated circuits. Thus, the technology independent RTL netlist is mapped to create a netlist which is specific to a particular vendor's technology/architecture.

One operation which is often desirable in this process is to plan the layout of a particular integrated circuit and to control timing problems and to manage interconnections between regions of an integrated circuit. This is sometimes referred to as "floor planning." A typical floor planning operation divides the circuit area of an integrated circuit into regions, sometimes called "blocks," and then reassigns logic to reside in a block. These regions may be rectangular or non-rectangular. This operation has two effects: the estimation error for the location of the logic is reduced from the size of the integrated circuit to the size of the block, and the placement and the routing typically runs faster because as it has been reduced from one very large problem into a series of simpler problems.

FIGS. 1A and 1B illustrate two methods in the prior art for performing floor planning in designing an integrated circuit. FIG. 1A illustrates a method in which floor planning is performed after a completed synthesis from HDL code. The method 10 of FIG. 1A begins an operation 12 in which an HDL code for a particular integrated circuit design is prepared; no attempt at floor planning is made when writing the source code. In operation 14, the HDL code is compiled to generate an RTL netlist. In operation 16, logic optimization is performed on the RTL netlist. This optimization typically involves substituting different gate types or combining or eliminating gates or interconnections, and often results in reordering the hierarchies and relationships between the original RTL objects and the underlying source code that produced the RTL objects. In operation 18, the optimized RTL netlist is mapped to a selected target architecture to generate a technology specific netlist. Floor planning occurs in operation 20 after operation 18 by specifying specific portions of the technology specific netlist and assigning these portions to specific portions of the integrate circuit. After floor planning in operation 20, conventional place and route software tools may be used in each area to create circuitry implemented in the vendor's target technology.

FIG. 1B shows a method 25 which involves floor planning before HDL compilation. In this case, HDL code for two regions of an integrated circuit is separately prepared along with an interconnect HDL code as shown in operations 26, 28, and 30. Then in operation 32, there is a second synthesis for each region and for the interconnect. Then place and route software tools may be used within each region to create circuitry in each region as indicated in operation 34.

The method shown in FIG. 1A can improve the placement and routing processes, but this method typically prevents the use of operation 16 or at least seriously impacts the logic optimization process. Also, floor planning after synthesis as in the case of FIG. 1A, is considerably more difficult because the understanding of a design has deteriorated due to the loss of the contextual information from the HDL code which has been hidden within the design's programmable logic cells and the level of detail has increased dramatically.

In the case of the method of FIG. 1B, the placement information can be used by the synthesis tool to make logic optimization decisions. Unfortunately, it is not easy to know whether the capacity of a block has been overflowed or which logic has the most critical timing impact. In addition, the design's granularity prevents manipulation of lower level functions such as counters, adders, state machines, etc.

From the foregoing it can be seen that it is desirable to provide an improved method for designing an integrated circuit.

SUMMARY OF THE INVENTION

The present invention provides methods and apparatuses for designing an integrated circuit. In one exemplary method, a hardware description language code is compiled to produce a technology independent RTL (register transfer level) netlist. A portion of an area of an integrated circuit is allocated to a specific portion of the technology independent RTL netlist. In a typical example of this invention, the allocation restricts circuitry created from the specific portion of the technology independent RTL netlist to a selected portion of the integrated circuit.

In another aspect of an embodiment of the invention, a replication and/or splitting operation may be performed between allocated regions on the same IC or different ICs.

The present invention also provides digital processing systems which are capable of performing methods of the present invention, and the invention also provides machine readable media which, when executed on a digital processing system, such as a computer system, causes the system to design an integrated circuit according to the present invention.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIG. 8A is an example of HDL source code which itself is hierarchical.

FIG. 8D shows only a portion of the technology mapped netlist.

DETAILED DESCRIPTION

Methods and apparatuses for designing an integrated circuit or a plurality of integrated circuits are described herein. In the following description, for purposes of explanation, numerous specific details are set forth in order to provide a thorough understanding of the present invention. It will be evident, however, to one skilled in the art that the present invention may be practiced without these specific details. In other instances, well-known structures, processes and devices are shown in block diagram form or are referred to in a summary manner in order to provide an explanation without undue detail.

Figure 1A:
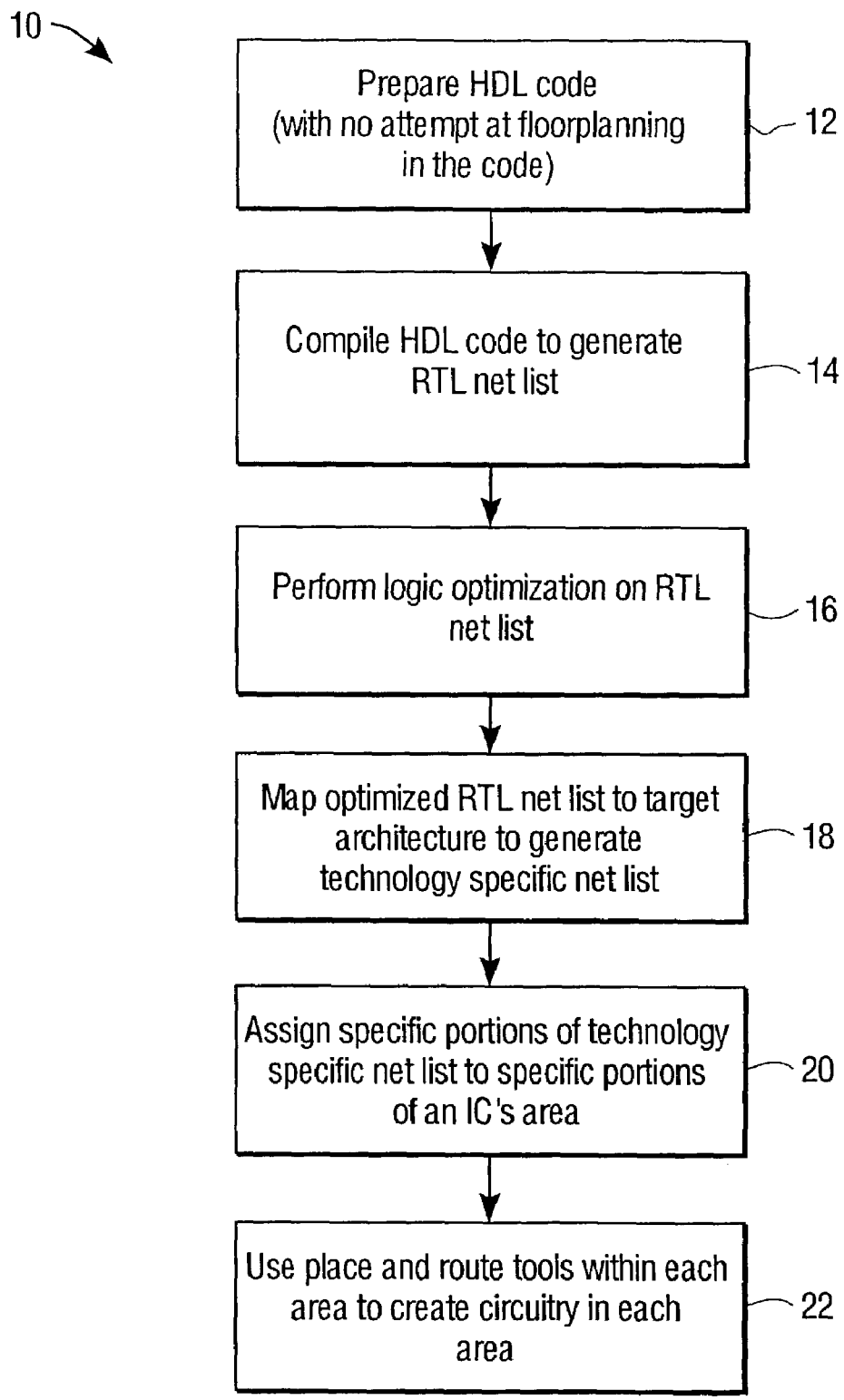
FIG. 1A and FIG. 1B show two methods in the prior art for designing integrated circuits.
Figure 1B:
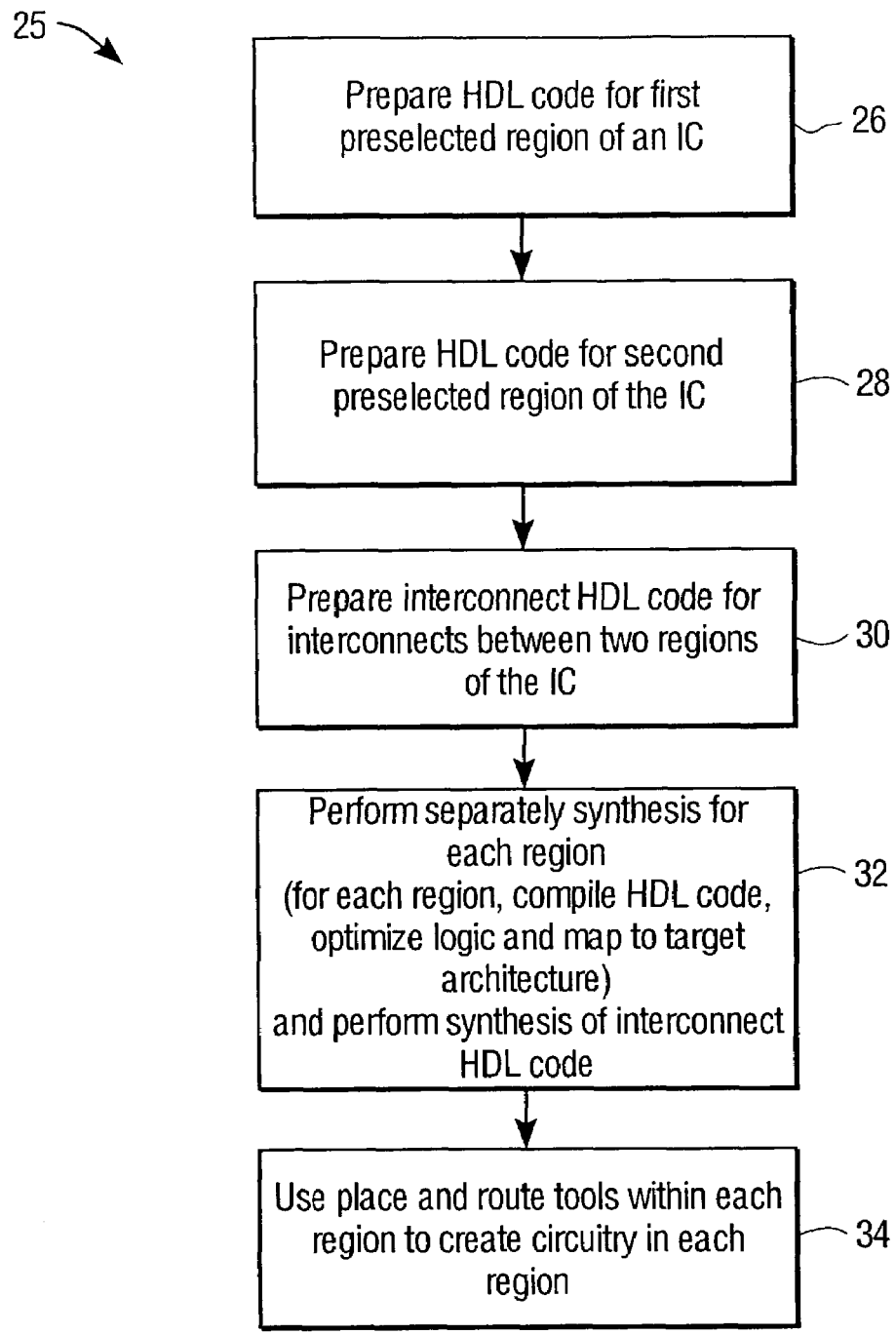
Figure 2:
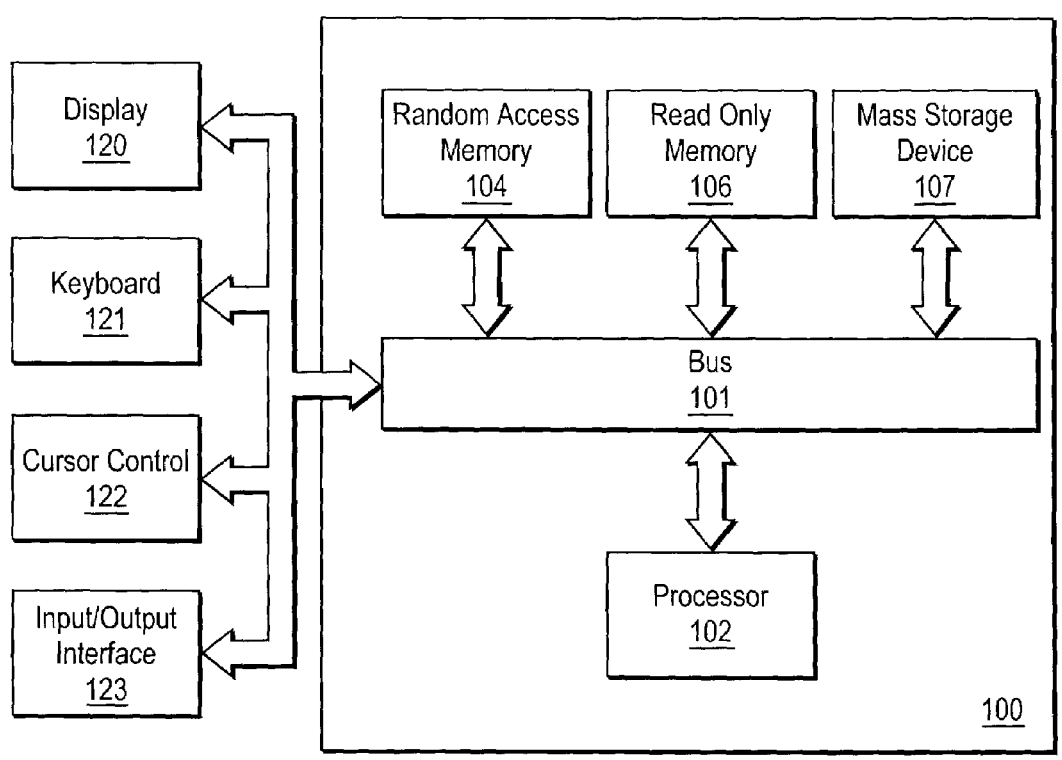
FIG. 2 is a block diagram of a digital processing system that may be used to implement embodiments of the present invention.

Many of the methods of the present invention may be performed with a digital processing system, such as a conventional general purpose computer system. FIG. 2 illustrates a block diagram of a computer system that may be used to implement embodiments of the present invention. The computer system is used to perform logic synthesis of a design that is described in an HDL code. The computer system includes a processor 102 which is coupled through a bus 101 to a random access memory 104 and a read-only memory 106 and a mass storage device 107. Mass storage device 107 represents a persistent data storage device such as a floppy-disk drive, a fixed disk drive (e.g., magnetic drive, optical drive, or the like). Processor 102 may be embodied in a general purpose processor (such as the Intel Pentium® processors) a special purpose processor or a specially programmed logic device. Display 120 is coupled to the processor 102 through bus 101 and provides graphical output for the computer system. This graphical output is typically a graphical user interface which may be used to control the operation of the computer system. Keyboard 121 and cursor control device 122 are coupled to bus 101 for communicating information and command selections to processor 102. The cursor control device 102 will typically be a mouse or other cursor control device which will be used to control a cursor displayed on the display device 120. Also coupled to processor 102 through bus 101 is an input/output interface 123 which can be used to control and transfer data to and from electrical devices such as printers and other computers which are coupled to the computer system 100.

It should be noted that the architecture of FIG. 2 is provided for purposes of illustration only and that a computer system or other digital processing system used in conjunction with the present invention is not limited to this specific architecture.

Figure 3:
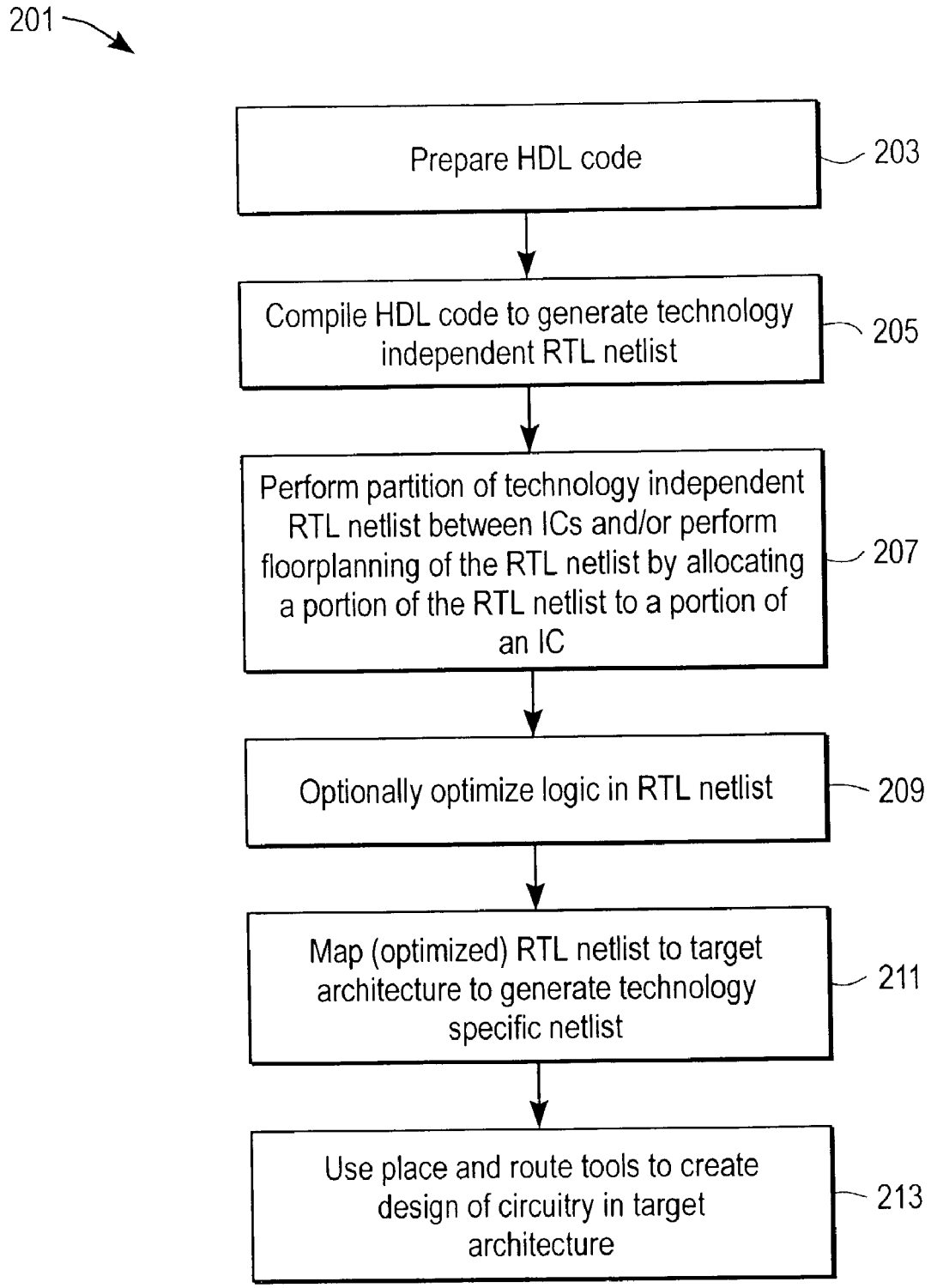
FIG. 3 is a flow chart illustrating operations of an HDL synthesis process that is used with embodiments of the present invention.

A general example of certain embodiments of the present invention will now be provided while referring to FIG. 3. While most embodiments of the present invention are intended for use in HDL design synthesis software, the invention is not necessarily limited to such use. Although use of other languages in computer programs is possible, embodiments of the present invention will be described in the context of use in HDL synthesis systems, and particularly those designed for use with integrated circuits which have vendor specific technology/architectures.

As is well-known, the target architecture is typically determined by a supplier of programmable ICs. An example of a target architecture is the programmed look-up tables (LUTs) and associated logic of the Xilinx XC integrated circuits which is a field programmable gate array from Xilinx, Inc. of San Jose, Calif. Other examples of target architecture/technology include those well-known architectures in FPGAs and complex programmable logic devices from vendors such as Altera, Lucent Technologies, Advanced Micro Devices, and Lattice Semiconductor. For certain embodiments, the present invention may also be employed with ASICs.

Figure 8B:
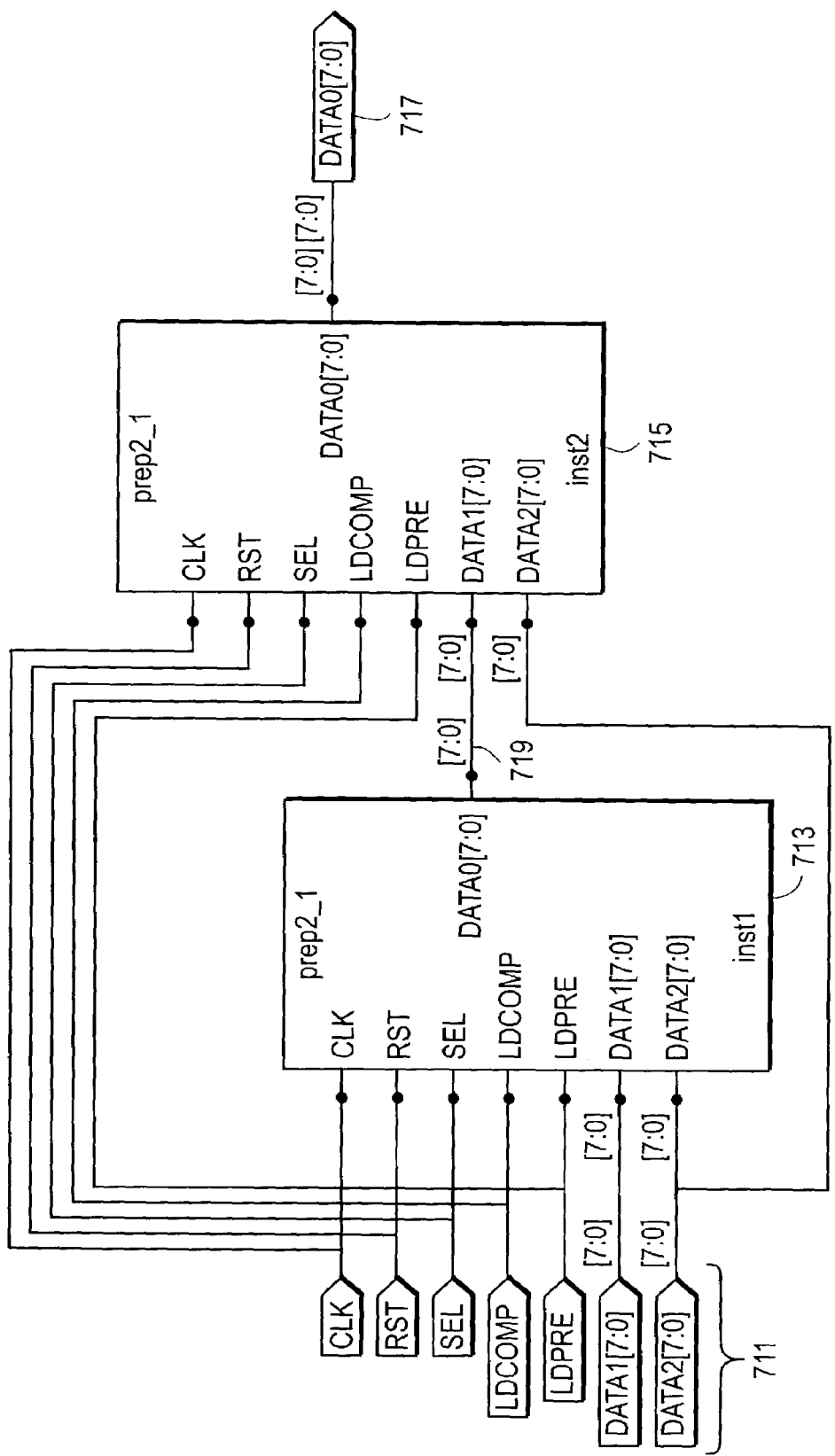
FIG. 8B is an example of a top level RTL netlist resulting from the compilation of the HDL source code shown in FIG. 8A.
Figure 8C:
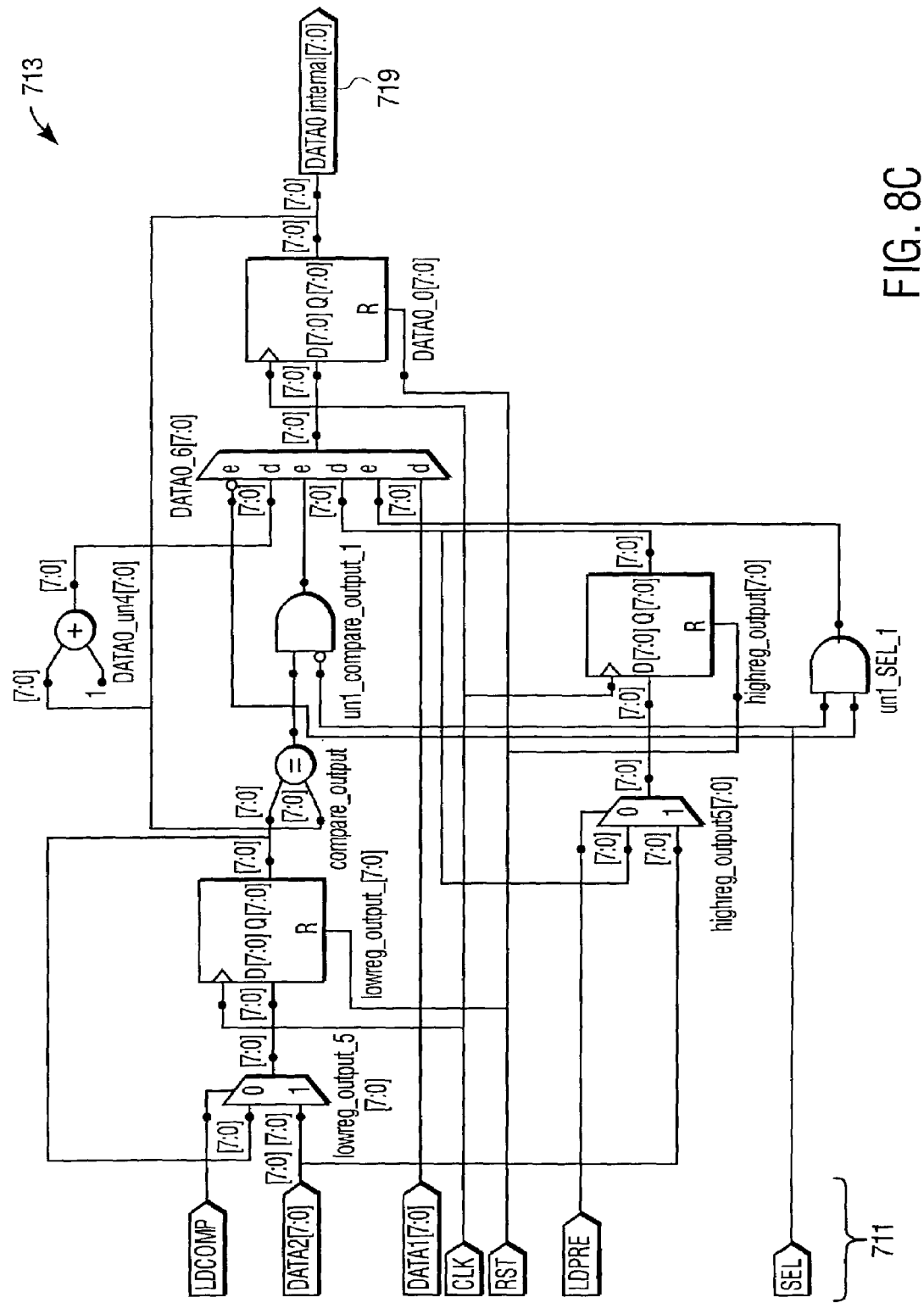
FIG. 8C is an example of the lower level of the RTL netlist which is derived from the lower level of the HDL source code shown in FIG. 8A.

The method 201 of FIG. 3 begins in operation 203 in which a designer writes HDL source code which describes the desired circuitry/logic (e.g. a behavioral description of a desired circuit). This source code is then compiled by an HDL compiler in operation 205 to generate a technology independent RTL netlist. This netlist is independent of the particular vendor's technology which means that it is independent of the library of building blocks (e.g., look-up tables, multiplexers, AND/OR arrays, and so on) that is used by a particular target architecture. FIG. 8A shows an example of HDL source code and FIGS. 8B and 8C show an example to two levels of technology independent RTL netlists generated from the compilation of the source code shown in FIG. 8A. In operation 207, a partition and/or a floor planning of the RTL netlist is performed. In the case of a partitioning, a portion of the RTL netlist is assigned to another integrated circuit. In the case of a floor planning, a portion of the RTL netlist is assigned to a particular region of an integrated circuit. In operation 209, the logic represented by the RTL netlist is optimized (e.g. the logic is optimized to improve timing parameters of the logic). This operation is optional and is used to remove duplicative interconnects and logic elements according to optimization routines. In operation 211, the RTL netlist (in either optimized or non-optimized form) is then mapped to the selected target architecture in order to generate the technology specific netlist. Then in operation 213, conventional place and route software tools are used to create a design of circuitry in the target architecture, such as a Xilinx or Altera FPGA.

The foregoing method shown in FIG. 3 will be understood to be one general example of a method of the present invention. As noted in operation 207, partitioning may be performed separately from floor planning in operation 207 such that only partitioning is performed in operation 207. Similarly, floor planning alone may be performed in operation 207. Alternatively, the combination of partitioning and floor planning may be performed in operation 207. Thus, operations relating to partitioning and/or floor planning are performed within an HDL synthesis process as opposed to before or after the synthesis is processed as in the prior art. This allows for, as described herein, improved interactivity in designing an integrated circuit and reduces the design time involved in designing an integrated circuit.

Figure 4A:
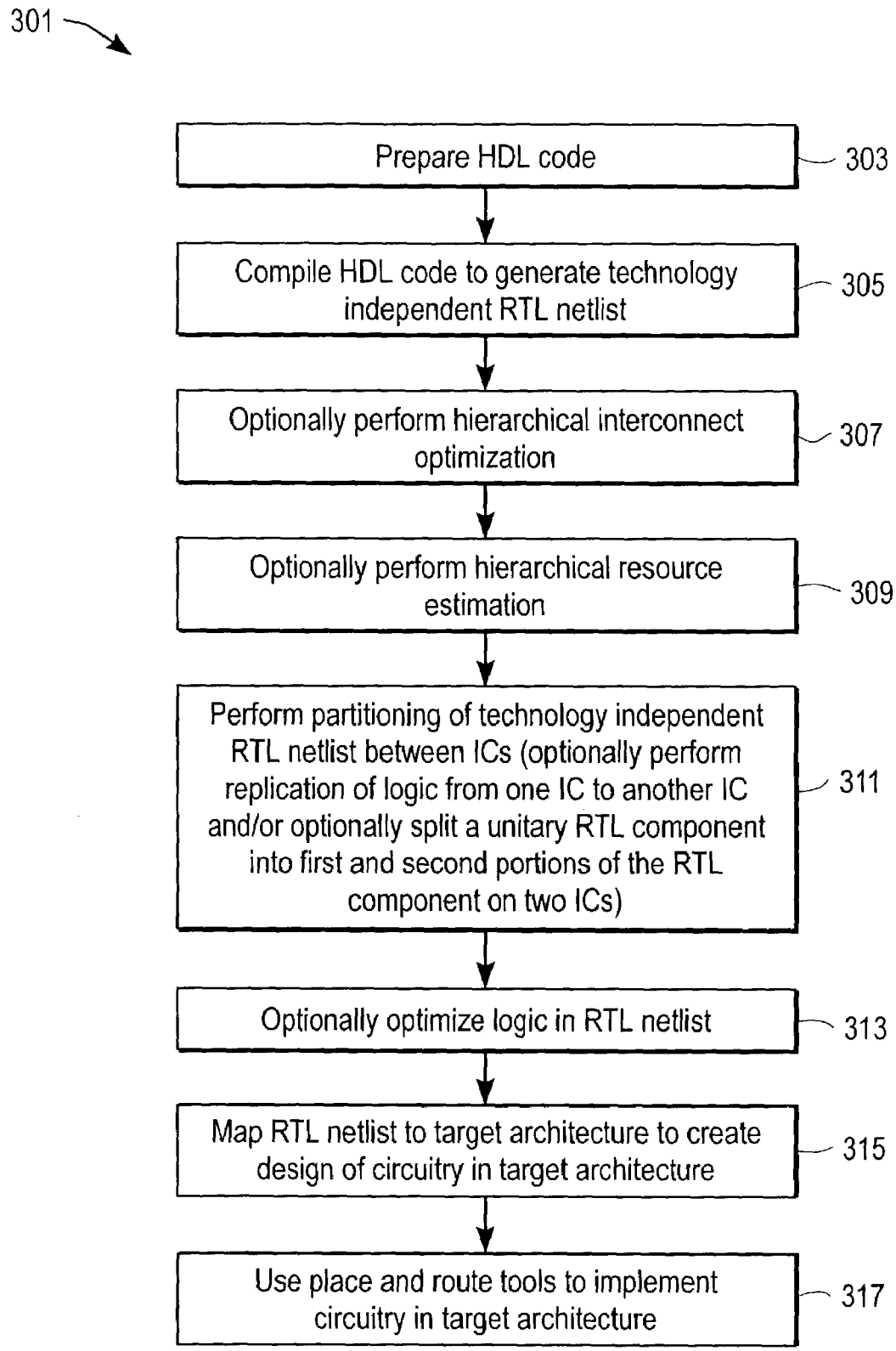
FIG. 4A is a flow chart illustrating one particular method of the present invention in which partition is performed within the synthesis process.
Figure 4B:
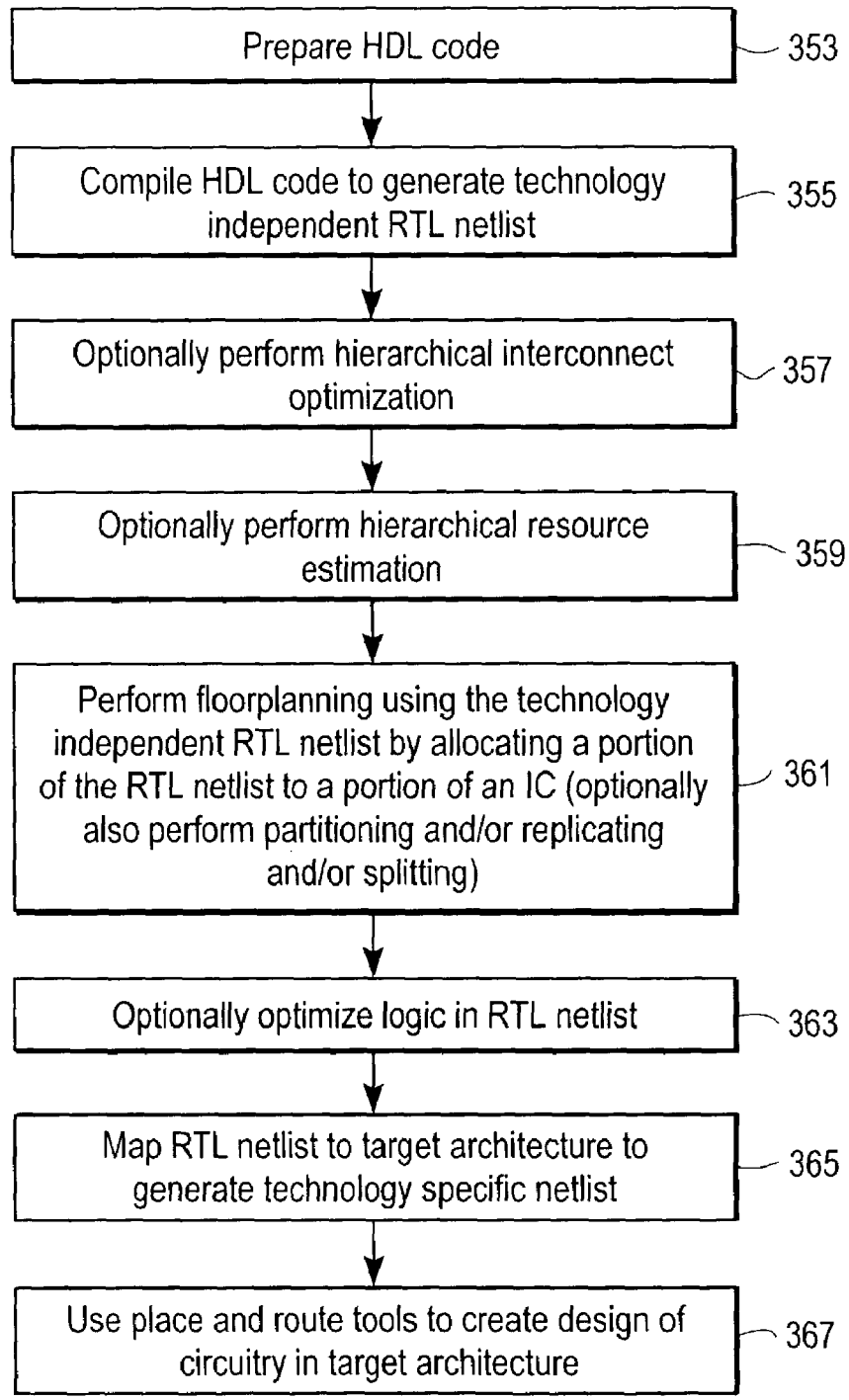
FIG. 4B shows an exemplary method of the present invention in which floor planning is performed within a synthesis process.

FIGS. 4A and 4B show specific examples of embodiments of the present invention for partitioning and floor planning respectively as separate aspects of the invention. However, as noted above, these two aspects may be used together in one embodiment of the present invention.

FIG. 4A shows a method 301 in which partitioning of technology independent RTL netlists is performed between several integrated circuits. The method begins in operation 303 in which an HDL source code is prepared. Then in operation 305, the HDL source code is compiled to generate a technology independent RTL netlist. Optionally in operation 307, a hierarchical interconnect optimization is performed. In operation 309, an optional hierarchical resource estimation is performed. Operations 307 and 309 will be described further below. These operations improve the process of partitioning and thus are often desirable but not necessary.

The technology independent RTL netlist is typically a higher level behavioral representation of the design. This conserves abstracted information for use by processes before the final mapping step. This differs from traditional synthesis tools that fragment designs into fine, low level (gate) representations immediately after doing language compilation. By preserving a higher level behavioral representation, a synthesis tool can perform optimization, partitioning and floor planning at a much more global level and typically deliver better results. By operating on abstracted data, the synthesis tool can also operate more quickly and handle larger designs.

After the optional operations 307 and 309, operation 311 involves the performance of a partitioning of the technology independent RTL netlist between integrated circuits. This typically involves a selection by a user or by the system automatically of certain RTL modules which are assigned to different integrated circuits. this divides the design across several integrated circuits while remaining under the logic and input/output limitations of each integrated circuit. In one embodiment of the present invention which is described below, a user partitions the design by selecting blocks from the RTL block diagram presented on a display device and dragging them onto the target FPGA device. One embodiment of the invention provides immediate feedback on the display device on a percentage of input/output utilization and area utilization for each device. This gives the user considerable control over the assignment of RTL components to separate integrated circuits and gives quick feedback of the consequences of partitioning decisions. One embodiment of the invention provides an easy to use graphical user interface, which is described below, which allows dragging and dropping of RTL objects onto different integrated circuits. This instructs the computer system to perform the partitioning operation 311 wherein the RTL netlist portions which were selected are partitioned among the integrated circuits as indicated. The hierarchical resource estimation operation 309 allows one embodiment of the invention to provide immediate feedback after this dragging and dropping operation. This feedback includes the percentage of input/output and area utilization for each integrated circuit and gives a user quick feedback of the consequences of a partitioning decision. Using the connectivity between the selected module which is dragged to a particular IC and all previously partitioned modules, one embodiment of the present invention computes the area and input/output impact of assigning the selected module to each of the FPGAs in a prototype system and feeds this information back to the user. The designer can then use the information to assign the selected module to the most appropriate FPGA while ensuring the resulting partition is within the requirements of the area of an integrated circuit and input/output utilization of a particular integrated circuit. When the partitioning operation is complete. this new arrangement of RTL netlists on different integrated circuits is then used to drive the final synthesis algorithms which typically map the RTL netlist to a particular target technology/architecture. It is noted that the choices of partitioning affect the circuit implementations so that the timing critical paths can be optimized while taking into account the delays associated with going on and off an integrated circuit and delays introduced by a printed circuit board. This is described further below.

Operation 311 may optionally include performing either a replication of logic from one integrated circuit to another integrated circuit or optionally splitting a unitary RTL component into a first and second portion of the RTL component onto two integrated circuits. The replicating and splitting operations which are optional within operation 311 are described further below.

Following operation 311, an optional optimization of logic in the RTL netlist is performed in operation 313. This optimization may be a conventional optimization and typically includes the removal of duplicative logic components and interconnects. In operation 315, the RTL netlist is mapped to a particular target architecture in order to create a design of circuitry in the target architecture. In operation 317, conventional place and route software tools may then be used to implement circuitry in the target architecture.

FIG. 4B shows a method 351 which includes a floor planning operation embedded within a synthesis according to an embodiment of the present invention. Operations 353, 355, 357, and 359 are similar to operations 303, 305, 307, and 309 of FIG. 4A. In operation 361, floor planning is performed using the technology independent RTL netlist by allocating a portion of the RTL netlist to a portion of an integrated circuit. Further, as an optional operation, partitioning and/or replicating and/or splitting may also be performed. Operations relating to replicating and/or splitting are further described below. Floor planning at this stage of the synthesis process allows for manipulations based on individual registers, but floor planning is not overwhelmed by the gate level detail that follows technology mapping. Floor planning before technology mapping provides an opportunity to replicate logic and/or split logic for performance purposes. This capability can help correct routing problems, because global routing can be reduced by replicating objects that have a small number of inputs and a large number of outputs. Performing floor planning at this stage of the synthesis process helps to reduce the number of iterations that are necessary to meet timing budgets. Another benefit will typically be the dramatic decrease in place and route processing times which are required in operation 367. Furthermore, many FPGA vendors have mechanisms in their place and route software tools that allow floor planning information to be passed for netlist-level placement.

Following operation 361, the logic may optionally be optimized in operation 363. Then in operation 365, the RTL netlist is mapped to a particular target architecture to generate a technology specific netlist. Then the particular vendor's place and route software tool is used to create a design of circuitry in the target architecture.

Figure 5A:
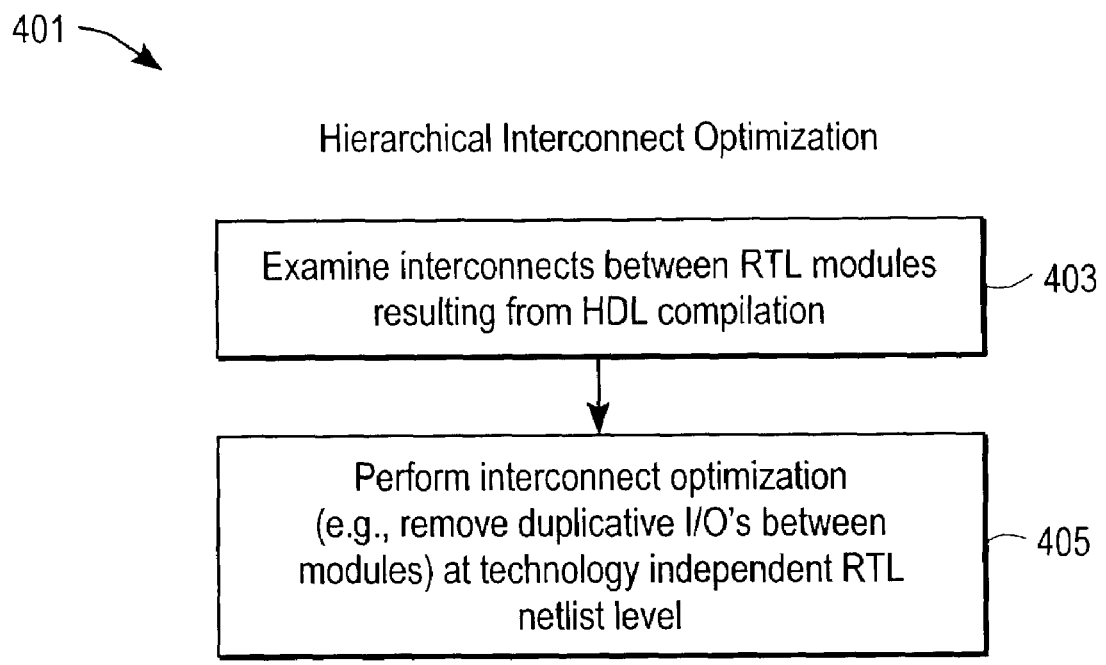
FIG. 5A shows an example of an optional process performed in the methods shown in the FIGS. 4A and 4B.
Figure 5B:
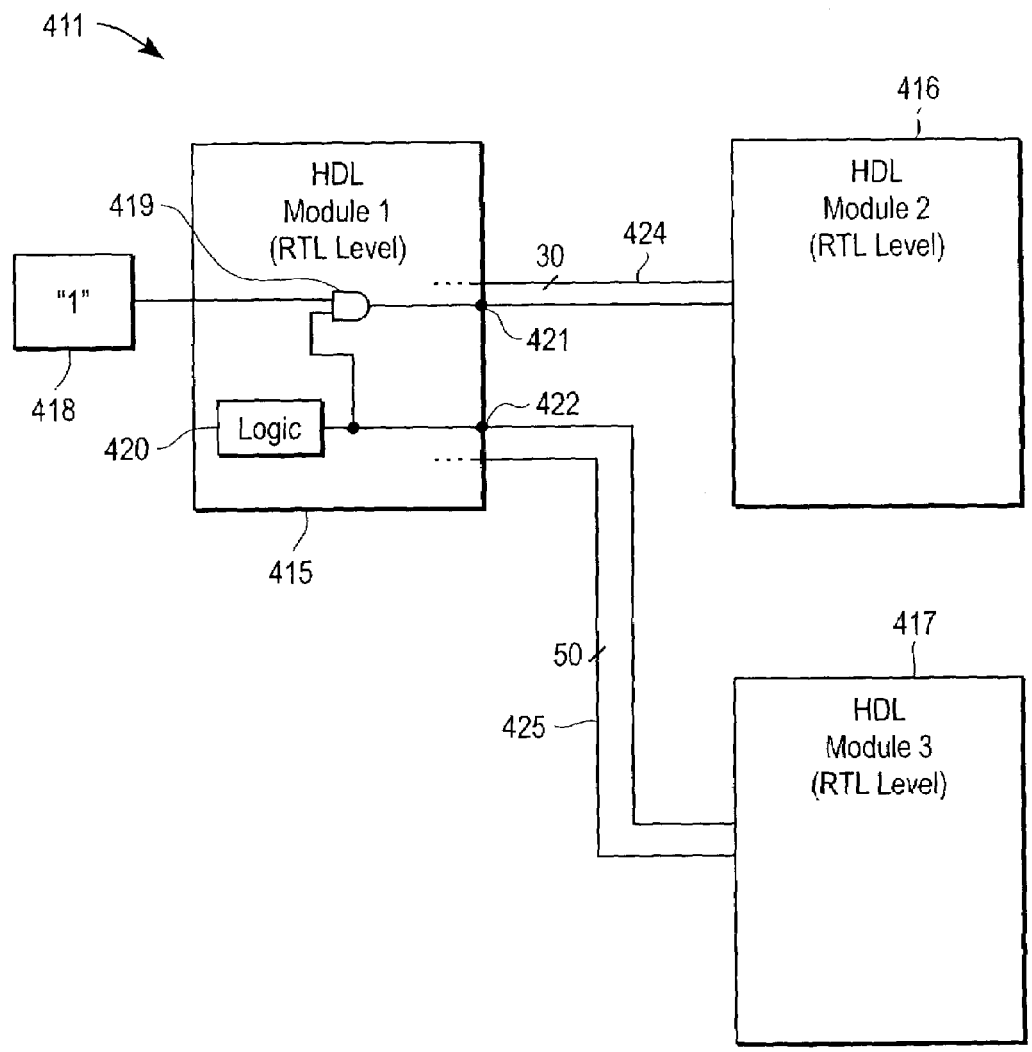
FIG. 5B shows an example of a hierarchical interconnect optimization technique.

Various aspects of the methods shown in FIGS. 4A and 4B will now be described while referring FIGS. 5A, 5B, 6, 7A, and 7B. FIG. 5A shows an example of a method for hierarchical interconnect optimization. The method 401 includes operations 403 and 405. In operation 403, the interconnects between the RTL modules are examined. The RTL modules result from the HDL compilation process, such as operations 305 or 355 of FIGS. 4A and 4B respectively. In operation 405, interconnect optimization is performed at the technology independent RTL netlist level. This typically will remove duplicative interconnects between the modules such as input/output connections between the modules. An example of this is shown in FIG. 5B. Three HDL modules are shown in the assembly 411 of FIG. 5B. HDL module 1 (at the RTL level) is shown as module 415. HDL module 2, shown as module 416 is coupled to module 1(module 415) by thirty interconnect lines 424 and by the interconnect output 421. This output from module 1 originates from the AND gate 419 which includes two inputs, a constant value one, labeled as 418, and an output from the logic circuitry 420. Given that the constant value is one, the AND gate 419 will always pass the output value from logic circuitry 420 as the AND gate's output. Thus the output 421 will always be the same as the output 422. Thus these two outputs can be tied together to reduce one output from the RTL level module 415 shown in FIG. 5B. Thus the operation 405 will identify these duplicative outputs or inputs to RTL level modules in the technology independent RTL netlist.

Figure 6:
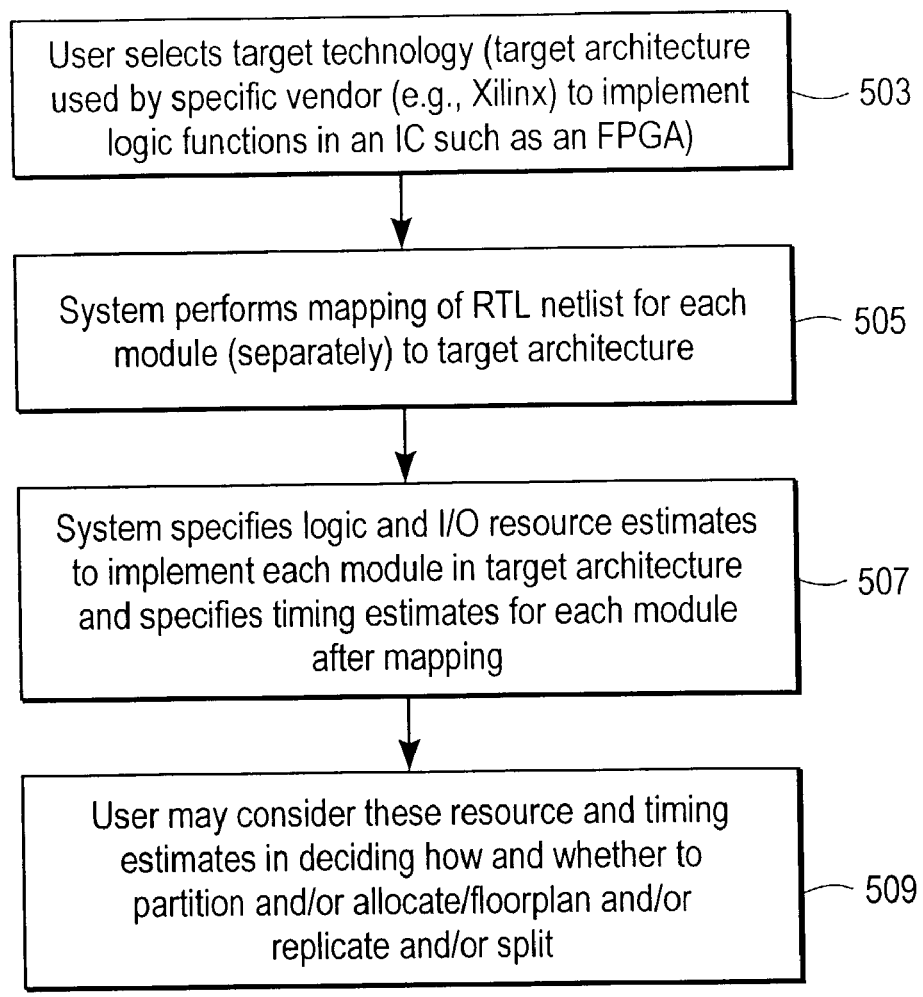
FIG. 6 shows an example of an optional method for performing hierarchical resource estimation which may be performed in the methods shown in FIGS. 4A and 4B.

FIG. 6 shows a method for performing hierarchical resource estimation, such as operations 309 of FIG. 4A and 359 of FIG. 4B. The method 501 of FIG. 6 begins in operation 503 in which a user selects a target architecture. Then in operation 505, the system performs a mapping for the purpose of estimation of the RTL netlist for each module. This mapping is to the target architecture selected in operation 503. The system in operation 507 then specifies logic and input/output resource estimates based upon the selection of the target architecture and the mapping performed in operation 505. These logic and resource estimates are based upon a synthesis which is designed to estimate the logic requirements and input/output requirements of the particular design in order to implement the module in the target architecture. Further, in one embodiment, these estimates specify the timing estimates for each module after the mapping operation. In operation 509, the user may consider these resource and timing estimates which are displayed to a user in deciding how and whether to partition and/or floor plan and/or replicate and/or split according to various aspects of the present invention.

Figure 7A:
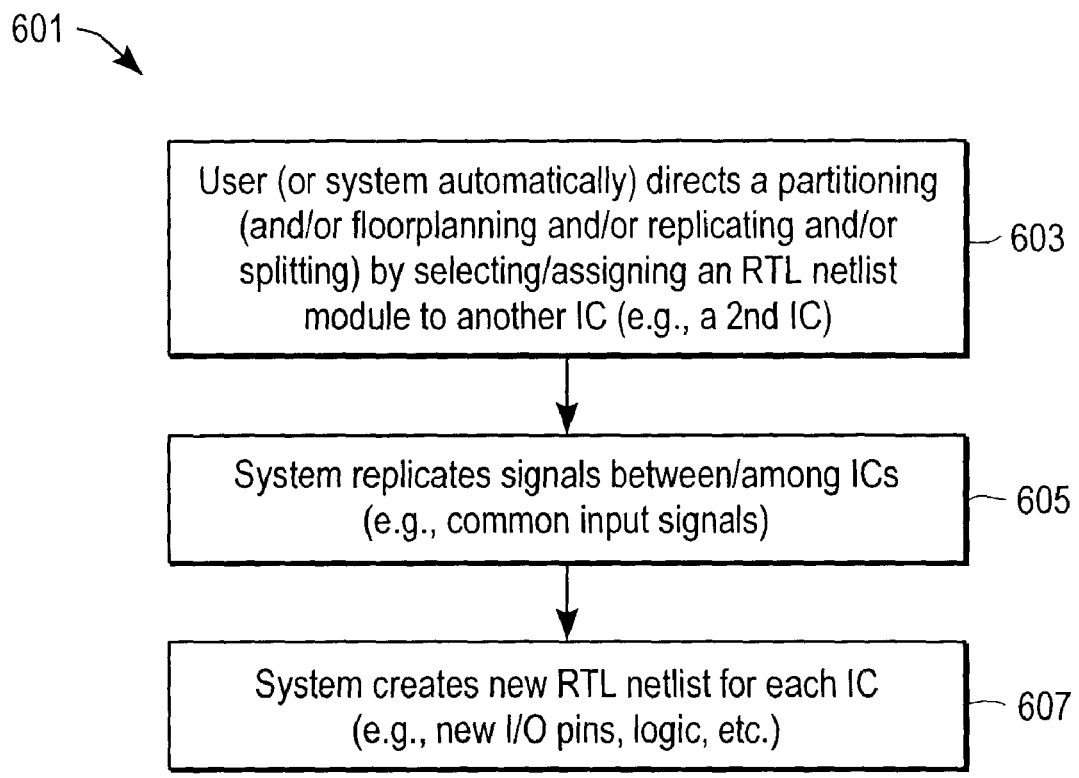
FIG. 7A shows an example of a partitioning operation according to the present invention.

FIG. 7A shows a method 601 in which a user may perform the operation 311 in the case of partitioning. Further, the user may optionally perform the replicating and/or splitting operations or may perform a floor planning operation by assigning an RTL netlist module to the same or another integrated circuit. It will appreciated that a partitioning and a floor planning may be combined in a series of operations in which a user selects one or more RTL netlist modules and indicates a placement on a different integrated circuit at a particular location or locations. After operation 603, operation 605 involves the replication of signals between the integrated circuits, such as input signals, and then in operation 607, the system creates a new RTL netlist for each integrated circuit.

Figure 7B:
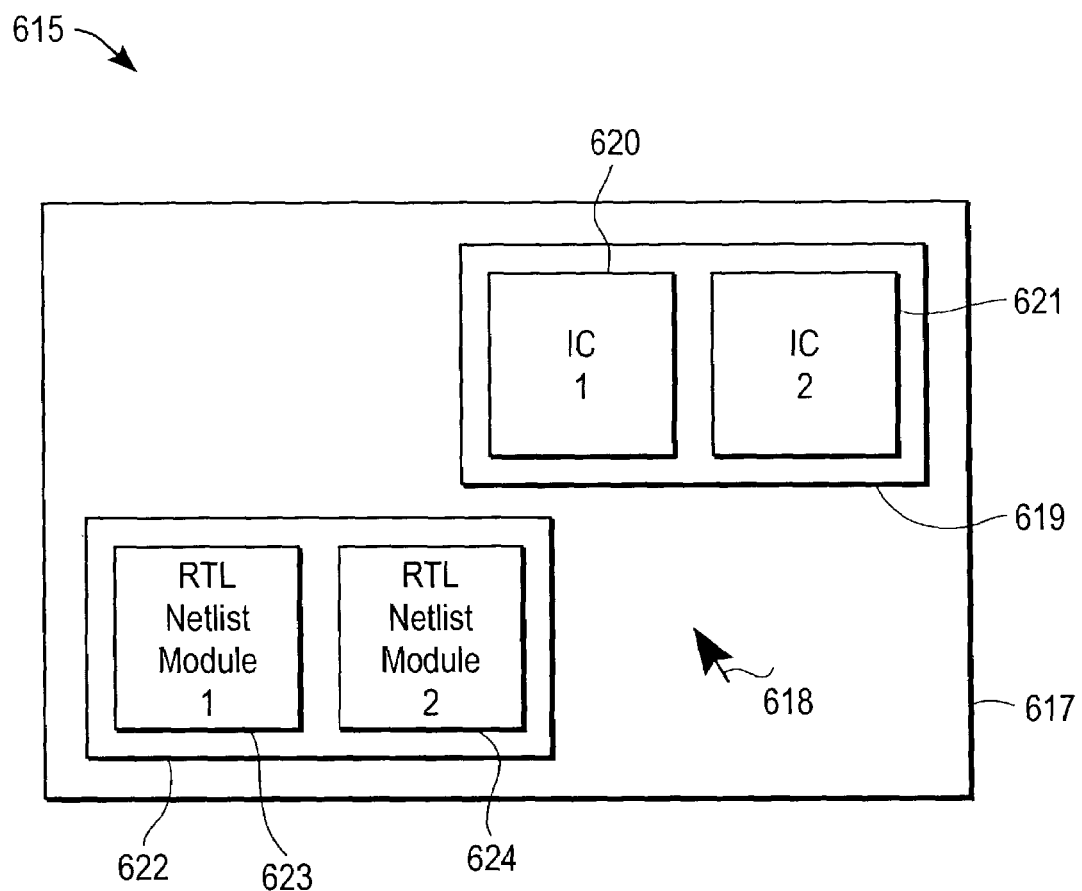
FIG. 7B shows an example of a user interface which allows for a partitioning to be used according to the present invention.

FIG. 7B shows an example of a user interface for performing a partitioning operation according to one aspect of the present invention. A display screen 605 is shown on a display device, such a display device 120. A window 619 includes a representation of the available area of two integrated circuits. These areas 620 and 621 may be used to specify partitions or floor planning operations. A cursor 618 may be used by a user to perform a drag and drop operation from a representation of an netlist module, such as the RTL netlist modules 623 and 624 shown in the window 622. In a typical partitioning operation, the user uses the cursor 618 to select a particular netlist module which is then dragged to one or the other of the areas 620 or 621 to specify the particular integrated circuit which is intended to receive the design of circuitry created the selected netlist. Thus for example, the user may select the netlist module 624 by positioning the cursor 618 over a region of the icon or image.

representing the netlist module 624 and by dragging the cursor after a selection of module 624 towards the area 620 representing integrated circuit one or the area 621 representing integrated circuit two within the window 619 thereby causing this netlist module to be partitioned to either integrated circuit.

Figure 8D:
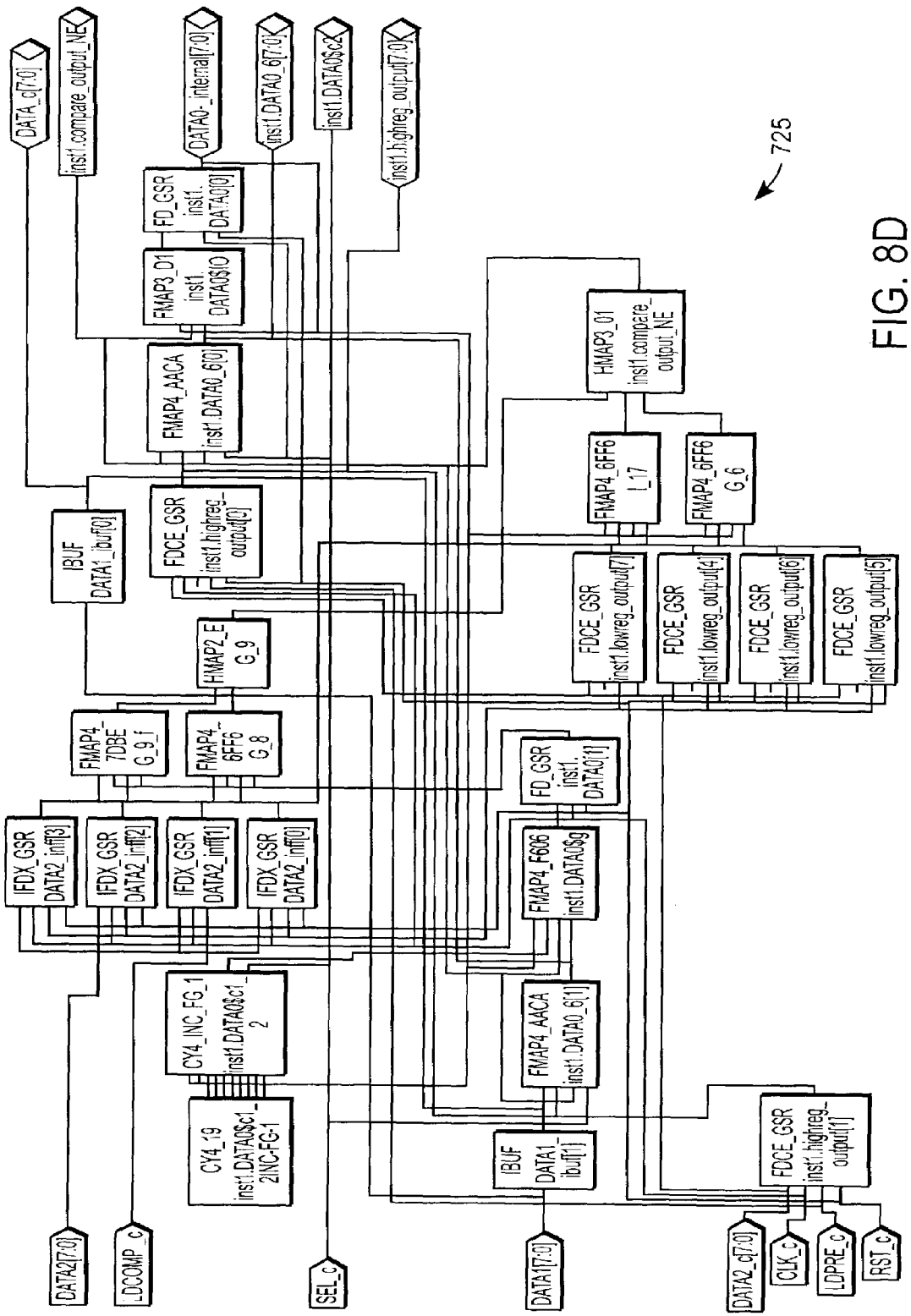
FIG. 8D is an example of a technology netlist which is obtained from mapping of the RTL netlist which itself was derived from the HDL source code shown in FIG. 8A.

Further aspects of the user interface as shown in FIG. 7B will now be described by referring also to FIGS. 8A and 8B. FIG. 8A shows HDL source code at two levels, a top level 703 and a bottom level 705. The top level source code 703 specifies the RTL representation shown in 8B, while the bottom level representation 705 specifies the RTL representation 713 shown in FIG. 8C. The top level RTL representation shown FIG. 8B includes two RTL modules 713 and 715 which in this case are identical and which are interconnected by interconnect 719. Input 711 feeds inputs to both RTL modules 713 and 715. The RTL module 715 provides an output 717. Thus, in one example, the RTL module 623 of FIG. 7B represents the RTL module 713 of FIG. 8B and the RTL module 624 of FIG. 7B represents the RTL module 715 of FIG. 8B. Thus, as shown in FIG. 7B, the user may select either module and partition it to a second integrated circuit such as the representation of the integrated circuit 621 shown in FIG. 7B. After the partitioning operation, a mapping operation is performed as described above resulting in a technology specific netlist, a portion of which is shown in FIG. 8D.

Figure 9A:
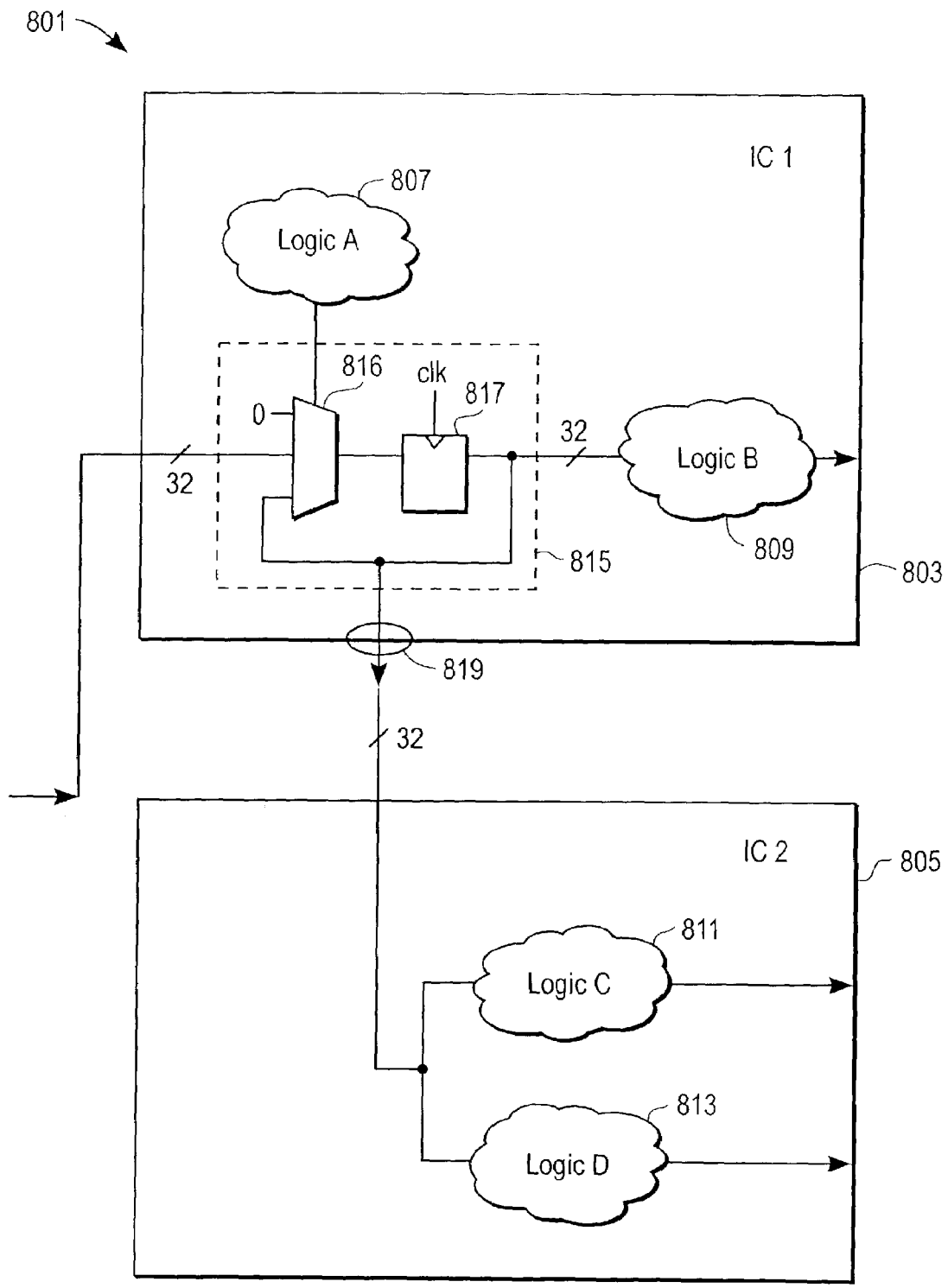
FIG. 9A shows an example of a design of two integrated circuits before the replication of certain logic according to the present invention.
Figure 9B:
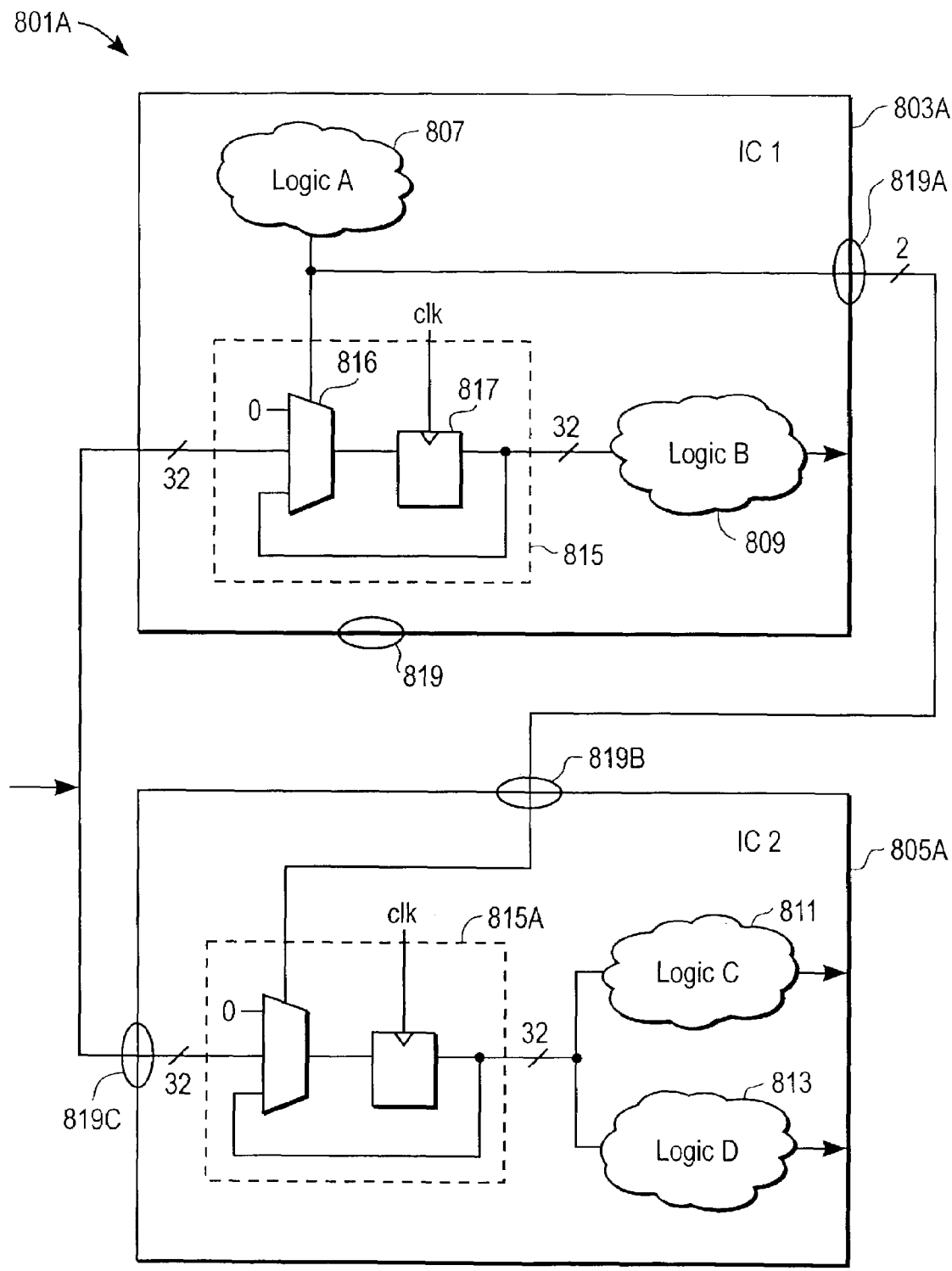
FIG. 9B illustrates the design of two integrated circuits after the replication according to one embodiment of the present invention.

FIGS. 9A, 9B, 9C and 9D will now be referred to in describing one aspect of the present invention which involves replicating logic between several integrated circuits. This aspect may arise as a result of a partitioning as in the present invention or without the partitioning of the present invention. FIG. 9A includes two integrated circuits 803 and 805 which are interconnected by a 32 bit bus fed by outputs 819 as shown in FIG. 9A. Integrated circuit 803 includes logic A and logic B labeled as logic 807 and logic 809. Further, a multiplexer 816 and a clocked register 817 are included within a logic block 815. Logic block 815 receives a 32 bit input and provides a 32 bit output to logic circuitry 809 and also to logic circuitry 811 and 813 in the integrated circuit 805 as shown in FIG. 9A. An RTL representation of these two integrated circuits may display this level of detail to a user after compiling an HDL code to generate the RTL netlist before a mapping operation. The user may recognize that a replication of the logic block 815 is desirable because the input/output limitations of the integrated circuit 803 have been exceeded by the design shown in FIG. 9A. This is in part due to the fact that a 32 bit input is required into the logic block 815 and a 32 bit output is required from the logic block 815 as shown in FIG. 9A. The user may reduce the requirements for input/output pins on the integrated circuit 803 by replicating the logic block 815 onto the integrated circuit 805. The resulting replication is shown in FIG. 9B in which the user has selected logic block 815 for replication causing the logic block 815 to be replicated onto the integrated circuit 805, now shown as the integrated circuit 805a with the replicated logic block 815a. Thus, the integrated circuit 803a has saved 32 outputs 819 as shown in FIG. 9B while adding two outputs 819a. The integrated circuit 805a in this example still has 32 bits in this case coming from the input 819c and has also added two inputs 819b from the logic A 807 as shown in FIG. 9B. Thus a minimal increase in input/output requirements for integrated circuit two as shown in FIG. 9B results in a significant decrease in input/output requirements for integrated circuit 803 as a result of the replication of the logic block 815.

Figure 9C:
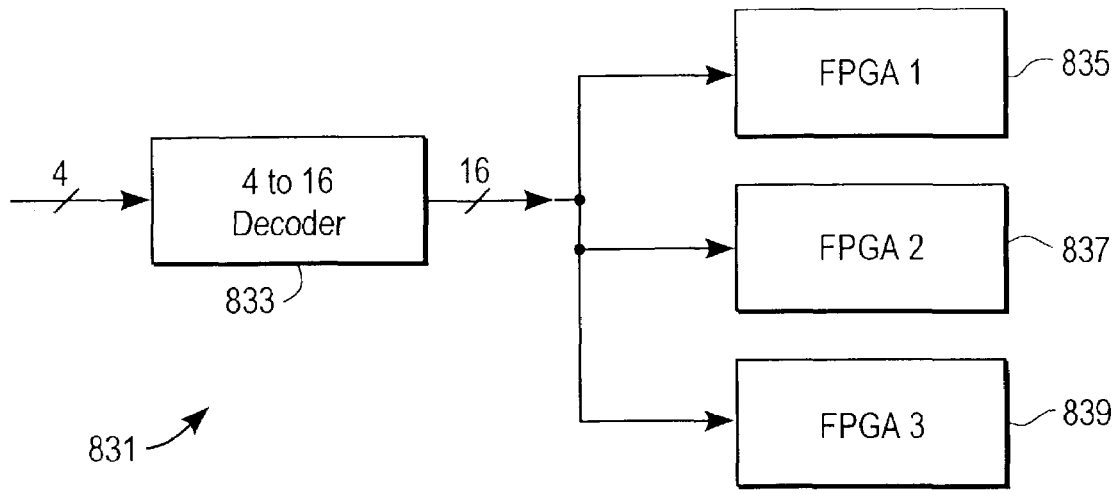
FIG. 9C and FIG. 9D illustrate another example of a replication of logic according to one embodiment of the present invention.
Figure 9D:
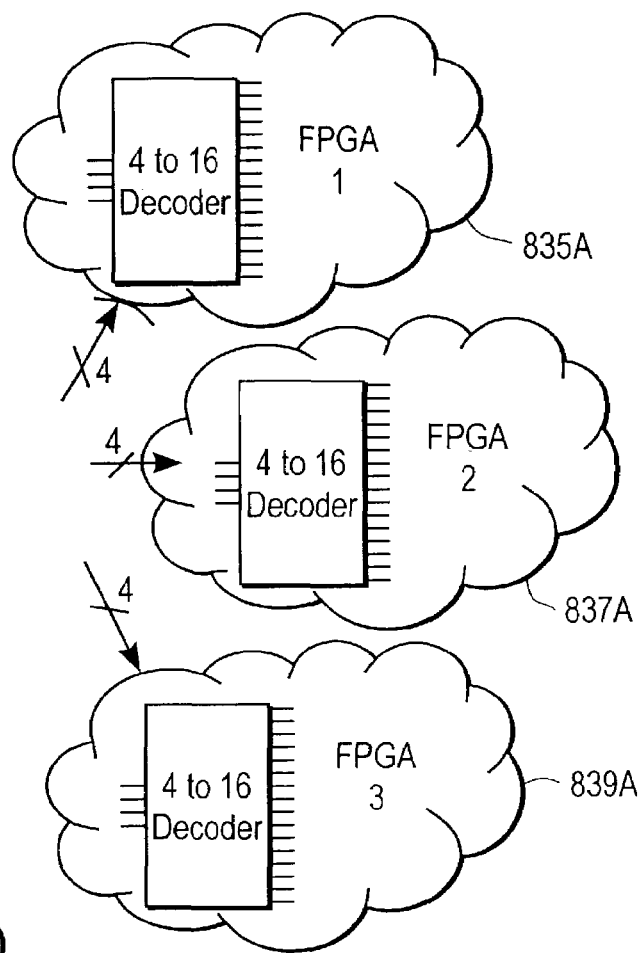

FIGS. 9C and 9D show another example of a replication operation in which a four integrated circuit system 831 shown in FIG. 9C is reduced to a three integrated circuit system shown in FIG. 9D by replicating the logic 833 onto three different FPGA integrated circuits 835, 837 and 839. In this case, the integrated circuit 833 is a 4 to 16 decoder which receives 4 inputs and provides 16 outputs to the three different integrated circuits 835, 837 and 839. By replicating the logic in the decoder into the three different field programmable gate arrays 835, 837, and 839, three integrated circuits may result as shown in FIG. 9D. In particular, three FPGAs 835a, 837a, and 839a may result by placing this decoder onto each of these three integrated circuits while increasing the inputs to each of these integrated circuits by four and the outputs from each of these integrated circuits by sixteen, assuming that each of the FPGAs can handle this increased input/output requirement. If the outputs from the decoders are not needed as an output from each IC, then there is a net decrease of 12 (16−4=12) I/Os for each IC.

Figure 9E:
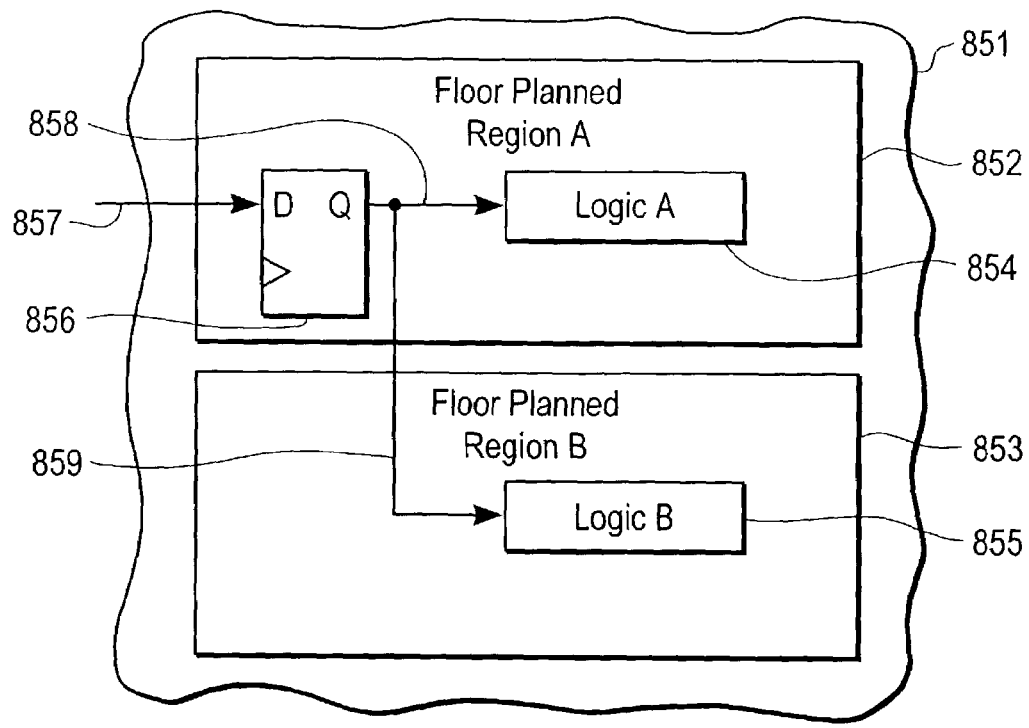
FIGS. 9E and 9F show another example of a replication of logic between two floorplanned regions either on the same IC or two different ICs.
Figure 9F:
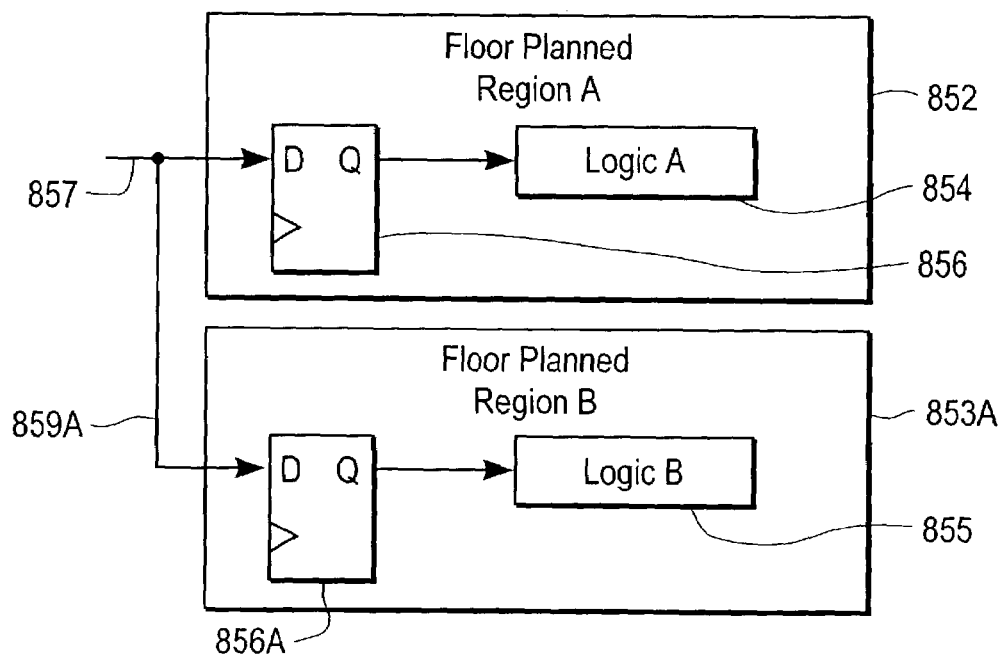

In another aspect of an embodiment of the present invention, a replication operation may be performed between floorplanned regions on the same IC or different ICs. FIGS. 9E and 9F show an example in which a register, originally designed for placement in one floorplanned region, is replicated to exist in two floorplanned regions. These two floorplanned regions may be on the same IC or different ICs. FIG. 9E shows two floorplanned regions 852 and 854 which may be on the same IC 851. The floorplanned region 852 includes logic A (labeled as logic 854) and register 856 which receives an input 857 and which provides an output 858 to logic A. The floorplanned region 853 includes logic B (labeled as logic 855) which receives an input through line 859 from output 858 of register 856 in floorplanned region 852. Due to timing problems (e.g. a delay in the line 859) it may be desirable to replicate the register 856 so that logic A and logic B receive their inputs at substantially the same time. The replication operation described herein may be performed between the two floorplanned regions, resulting in the system shown in FIG. 9F. The register 856 has been replicated into the floorplanned region 853A which, as before, includes logic 855 and now also includes register 856A which is coupled to the same input 857 as register 856.

FIGS. 10A, 10B, 10C, 10D, and 10E show another aspect of the present invention in which a single unitary RTL component is split into several RTL components among multiple (e.g. two or more) integrated circuits. A single unitary RTL component is a component in an RTL netlist. There are two kinds of such RTL components: (1) a simple RTL component which directly corresponds to an HDL language construct (AND; MULTIPLY; MUX, etc.) and (2) a higher level RTL component which is derived from a collection of simple RTL components and which is recognized by an HDL compiler as a RTL component (well known examples of such higher level RTL components include abstractions of components such as counters, ROMs, RAMs and State Machines, etc.). Either kind of such RTL component may be considered to be a single RTL component in an RTL netlist. In the examples shown in FIGS. 10A and 10B, a read only memory (ROM) is split into two RTL components for placement onto two different integrated circuits. The initial design shown in FIG. 10A includes a ROM specified by a single unitary RTL component 903. This ROM has a 12 bit input and a 100 bit data output. This ROM 903 is designed for placement on the integrated circuit 901 which also includes a logic circuitry 905 and logic circuitry 907 labeled as logic A and logic B respectively. When the input/output requirements of all the circuitry shown in FIG.

Figure 10A:
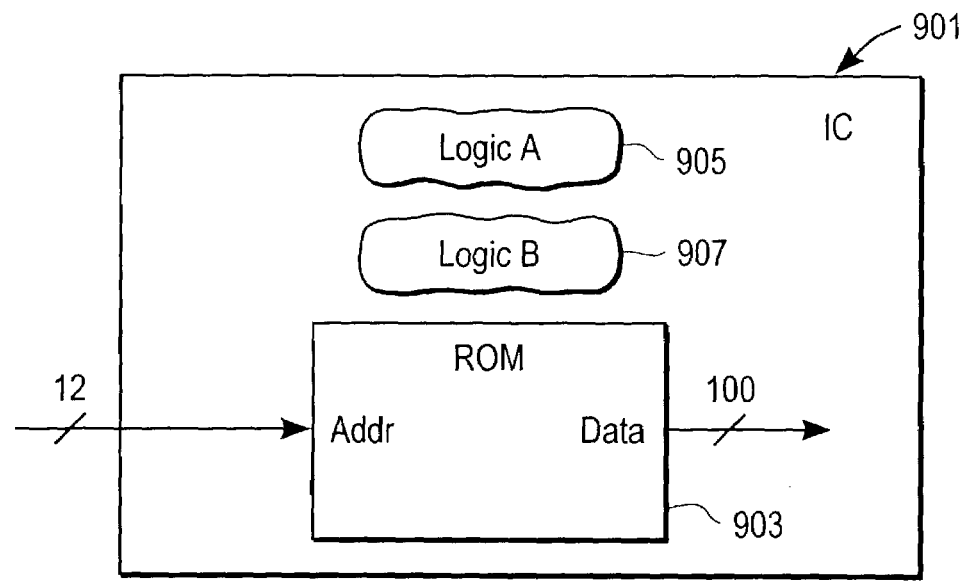
FIG. 10A and FIG. 10B illustrate an example of a method splitting an RTL component according to one embodiment of the present invention.
Figure 10B:
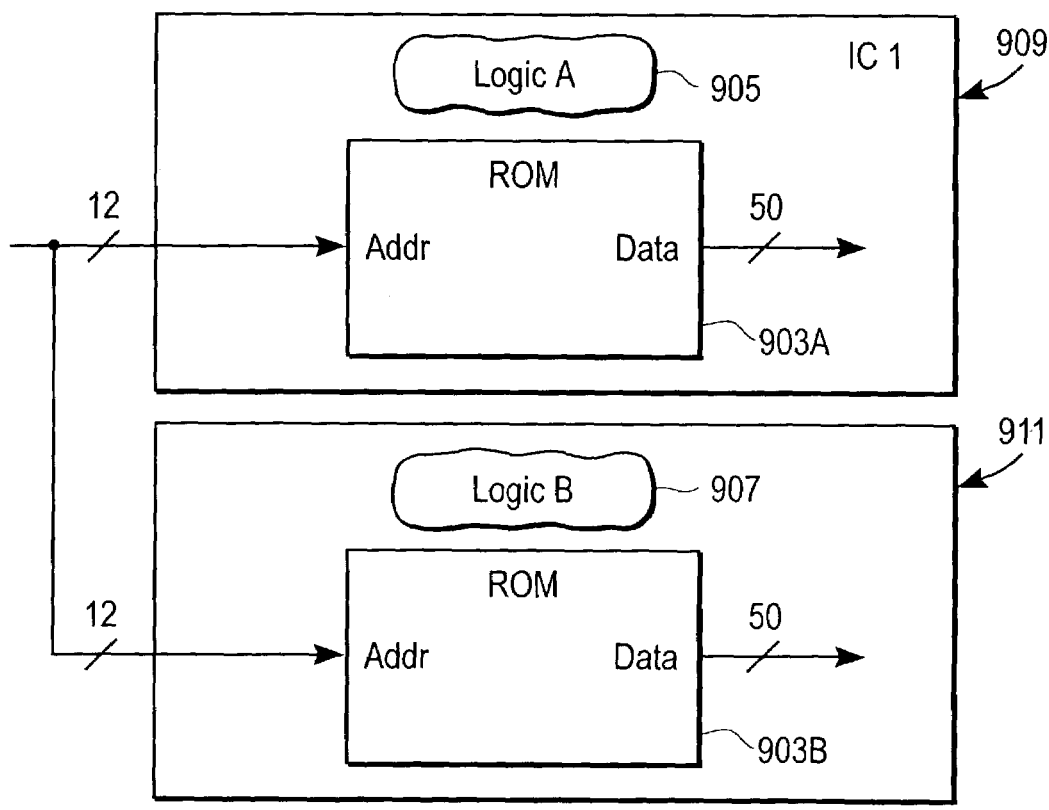

10A exceeds the input/output availability of a particular desired IC, then the designer may split the RTL component 903 into two components on two separate integrated circuits as shown in FIG. 10B. This results in the integrated circuit 909 which includes the logic circuitry 905 and a portion of the ROM 903 shown as 903a in FIG. 10B. The integrated circuit 911 now includes the logic 907b which has been partitioned to the integrated circuit 911 according to an aspect of the present invention and the ROM 903 has been split onto the integrated circuit 911 to create the ROM portion 90b as shown in FIG. 10B. In this way, the ROM 903 originally shown in FIG. 10A now has been split between two integrated circuits.

Figure 10C:
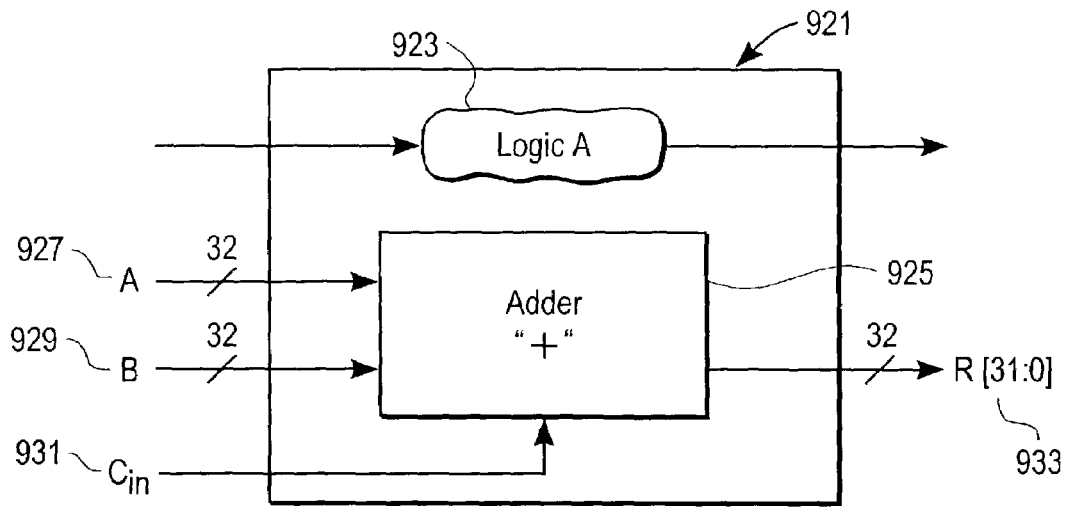
FIG. 10C and FIG. 10D illustrate another example of splitting an RTL component according to one embodiment of the present invention.
Figure 10D:
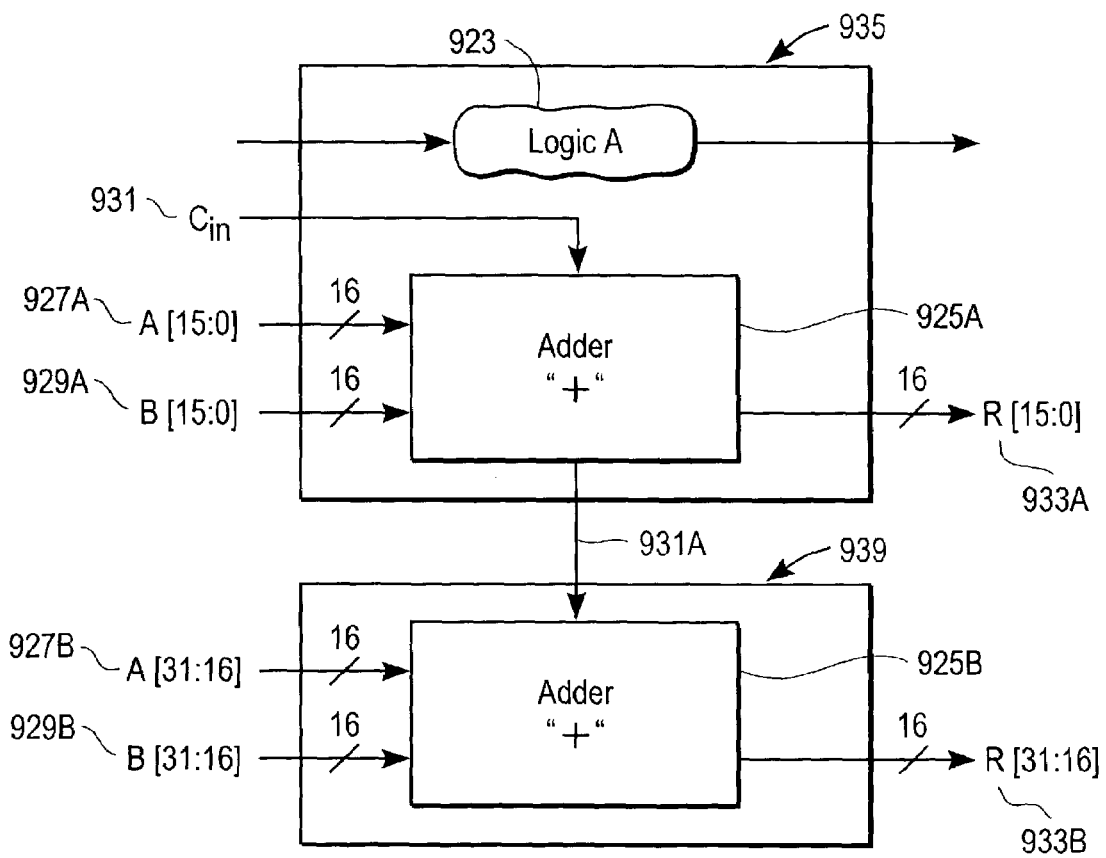

FIGS. 10C and 10D show another example of a splitting operation in which an adder 925 is split into two adders between two integrated circuits 935 and 939. Prior to a splitting operation, the design is shown in FIG. 10C on an integrated circuit 925. This integrated circuit includes the logic circuitry 923 and the adder 925. The adder 925 includes the input A which is a 32 bit input 927 and the input B which is a 32 input 929. A carry-in input 931 is also received by the adder 925. A result output 933 is a 32 bit output. If these required inputs and outputs exceed the limitations of the integrated circuit 925, then the designer may split a single unitary RTL component, such as the adder 925 into two components on two separate chips as shown in FIG. 10D. In this case, two integrated circuits 935 and 939 are created. The integrated circuit 935 includes the logic 923 and also includes a portion of the adder 925a. The other portion of the adder 925b is now located on the integrated circuit 939. Effectively, half of the inputs to the adder are now allocated to the integrated circuit 935 and the other half of the inputs are allocated to the integrated circuit 939. Similarly, half of the outputs are obtained from the integrated circuit 935 and half of the outputs are obtained from the integrated circuit 939 for the adder.

Figure 10E:
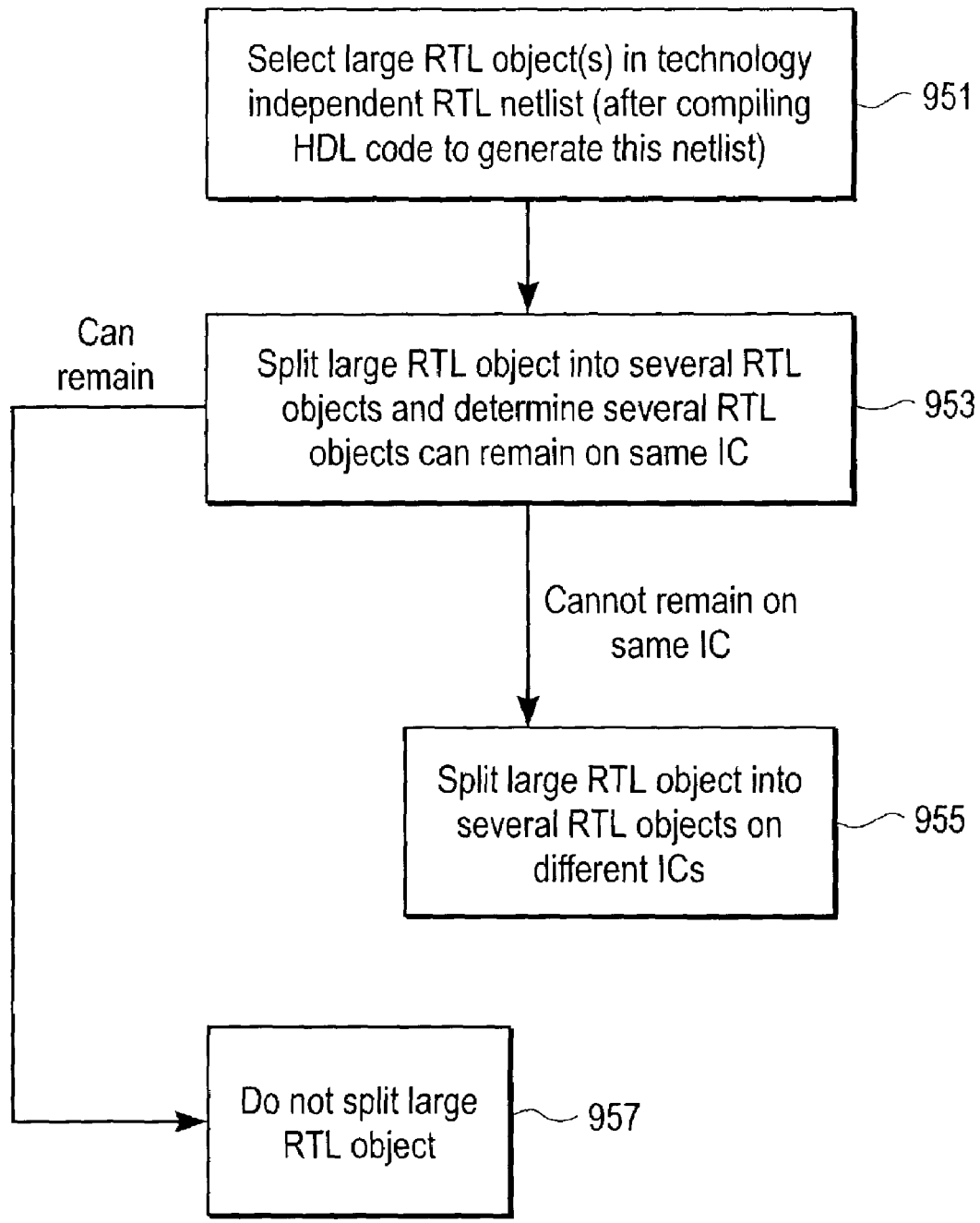
FIG. 10E shows an example of an embodiment of a method according to the present invention in which the splitting of an RTL component may be performed automatically.

FIG. 10E shows an example of an automatic process for performing a splitting of a single RTL component. This method begins in step 951 in which a single large RTL component is selected from the technology independent RTL netlist. It will be appreciated that multiple such components may each be selected for a splitting operation. Then in operation 953, a large RTL component is split into several RTL components and then it is determined whether these components after the splitting can still remain on the same integrated circuit given the area limitations of the integrated circuit and given the input-output limitations of the integrated circuit. If after splitting the several integrated circuits can remain on the circuit then the decision is made to proceed to operation 957 in which the splitting is not allowed. If on the other hand the split components cannot remain on the same integrated circuit, the operation 955 is performed in which the large RTL component is split into several RTL components on different integrated circuits.

In another aspect of an embodiment of the present invention, a splitting operation may be performed between floorplanned regions on the same IC or different ICs. For example, if a ROM or adder is located in one of two floorplanned regions on an IC, the ROM or adder may be split (as in the case of FIG. 10B or 10D respectively) such that part of the ROM or adder may be located in one floorplanned region and another part may be located in another floorplanned region on the same IC. Splitting an RTL component between floorplan regions may result in a reduction of I/O (input/output) requirements. Furthermore, such splitting may be useful when a single RTL component cannot be fit into a floorplan region, which may occur in the case of certain FPGAs where regions, which may be allocated as a floorplanned region, are predetermined by the architecture of the FPGA. An example is the Altera Flex architecture which organizes available logic cells into rows.

Figure 11A:
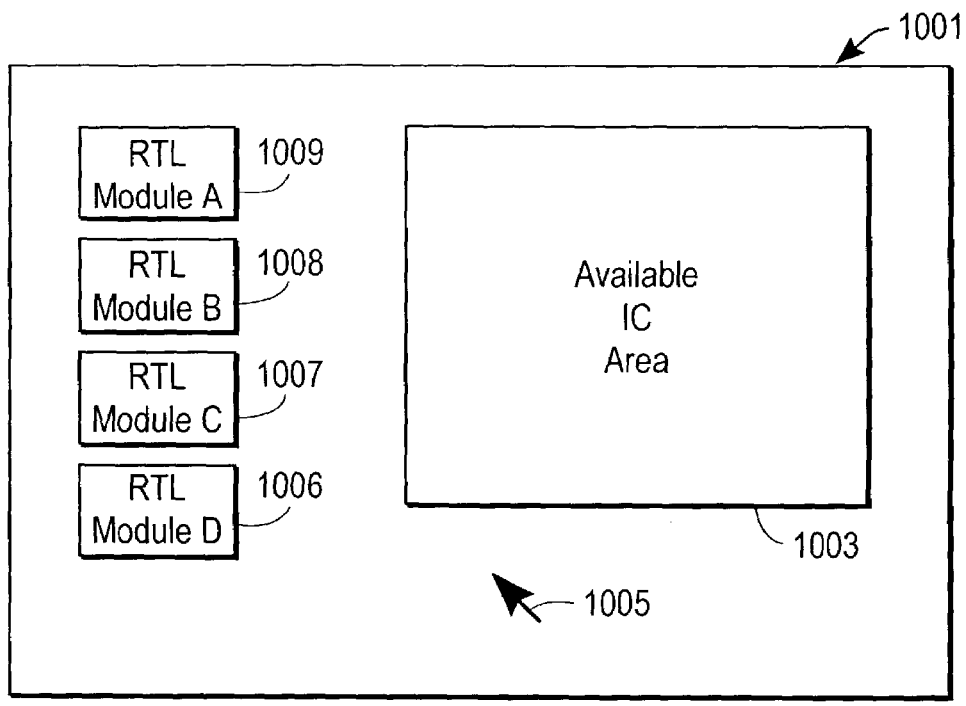
FIG. 11A and FIG. 11B illustrate an example of a user interface for performing a floor planning operation.
Figure 11B:
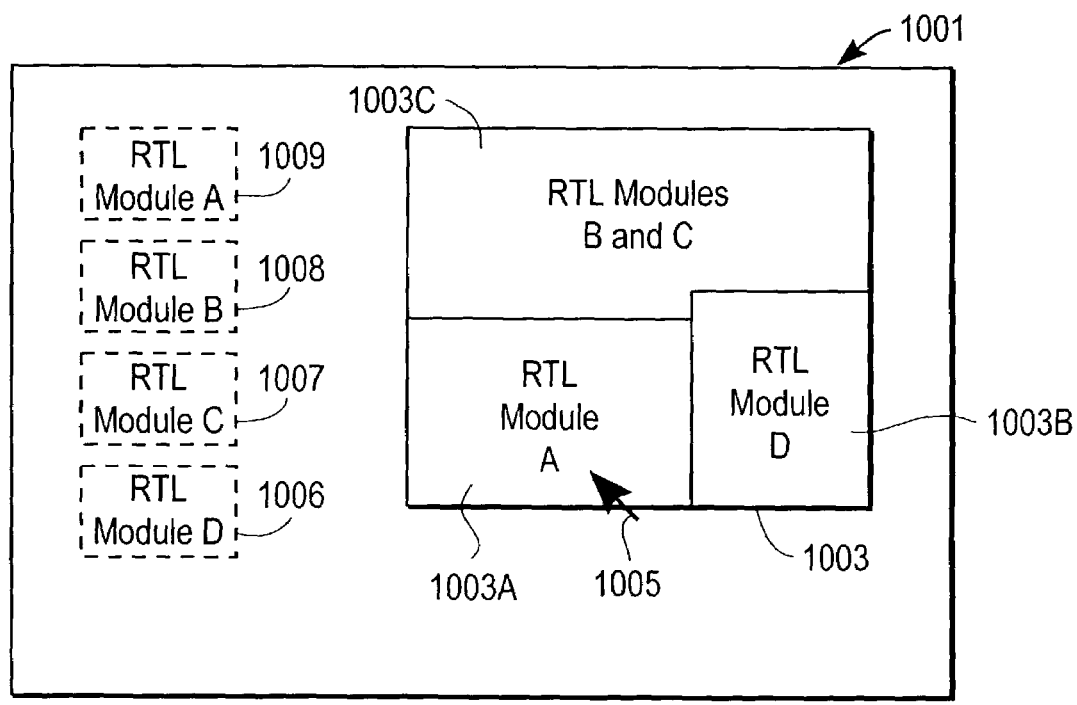

FIGS. 11A and 11B will now be referred to while describing one embodiment of a floor planning method according to the present invention. This embodiment may use a graphical user interface within a window 1001 on a display device. This window 1001 includes a window 1003 which represents the available integrated circuit area and also includes areas which represent various RTL netlist modules, such as modules 1006, 1007, 1008, and 1009. A cursor 1005 which is movable under the control of the user is also shown on the display within the window 1001. The user may control the position and functionality of the cursor using a conventional cursor control device such as a mouse. A user may position the cursor 105 over a particular module, and may select the module and drag and drop the module onto an available IC area. In this manner a user may perform a floor planning operation by specifying the placement at a particular location on one IC. When multiple ICs are available, multiple IC windows 1003 may also be displayed within the window 1001 for concurrent partitioning and/or floor planning operations.

FIG. 11B shows an example of the result of a floor planning operation in which in the user has allocated the available integrated circuit area within the window 1003 by performing certain operations or commands with a computer system. In one embodiment, the user may drag and drop each of the four modules 1006, 1007, 1008 and 1009 into the window 1003, and the system may automatically determine the available area required by each of the modules. In one embodiment of the invention, the resource estimation process in operations 309 and 359 may be used to determine the available IC area required for each of the modules. This allows the system to automatically allocate a portion of the IC upon the user specifying that a particular module is to be placed at a certain position on the integrated circuit. As shown in FIG. 11B, modules B and C have been combined into the region 1003c of the IC while module A has its own region 1003a, and module D has the area 1003b as shown in FIG. 11B.

Figure 12:
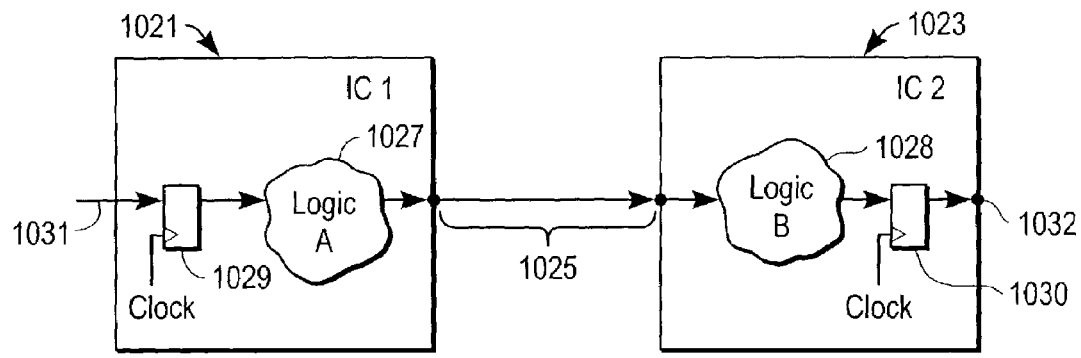
FIG. 12 shows an example of an optimization process which may be performed as one aspect of an embodiment of the present invention.

FIG. 12 shows one example in which a partitioned design may, after partitioning, utilize a known or estimated interchip or inter region delay 1025 in order to optimize the logic in the RTL netlist in order to meet system timing goals, such as in operation 209 shown in FIG. 3. In particular, after a partitioning operation, two integrated circuits 1021 and 1023 may result from the partitioning. A known or estimated interchip delay resulting from the delay of the interconnect on a printed circuit board, such as the interchip delay 1025 may be used in the optimization process, such as the process 209 or 313 described above. In particular, the interchip delay 1025 may be included in the timing constraints used in analyzing the timing from the input 1031 to the output 1032 between two integrated circuits 1021 and 1023. The input 1031 is first received by the clocked register 1029 which provides an input to the logic 1027 which outputs its signal through the interchip interconnect to the logic 1028 which then outputs its signal to the clocked register 1030 resulting in an output at the output 1032. Since the partitioning has occurred before the optimization process (e.g. the partitioning of operation 311 occurs before the optimization process 313 as shown in FIG. 4A) it is possible to include the timing delay resulting from the interchip delay 1025 in the timing constraints used during the optimization process.

Figure 13:
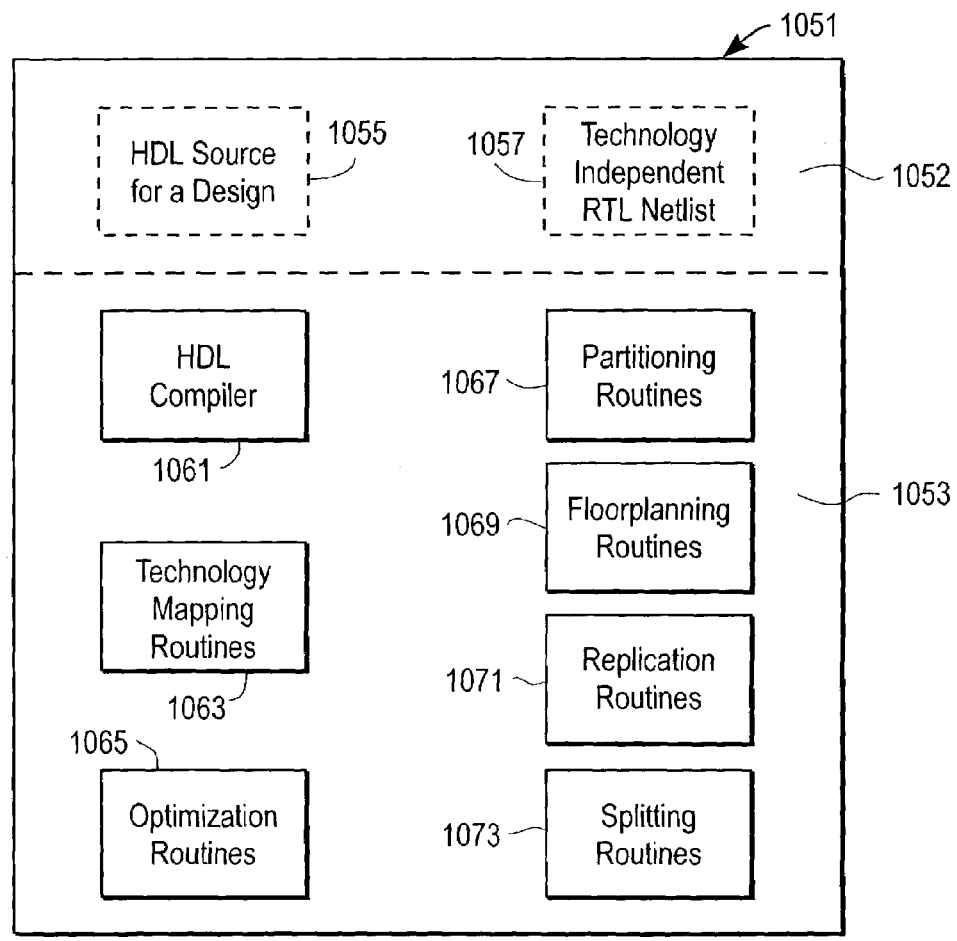
FIG. 13 shows an example of machine readable media according to one embodiment of the present invention.

One embodiment of the present invention may be a circuit design and synthesis computer aided design software that is implemented as a computer program which is stored in a machine readable media, such as a CD ROM or a magnetic hard disk or an optical disk or various other alternative storage devices. FIG. 13 shows an example of such media 1051 which includes in this case two partitions between what may be a volatile portion 1052 and a non volatile portion 1053. The volatile portion includes storage for source code and netlists which are compiled from the source code. In the example shown in FIG. 13, a source code HDL file 1055 is stored in the memory 1052 and, after the compilation of the source code, a technology independent RTL netlist 1057 is stored in memory which is typically non volatile, although not necessarily non volatile in certain instances. In a typical implementation, the portion 1053 will be non volatile memory, such as a CD ROM or a magnetic hard disk which will retain the programming instructions necessary to perform the various processes of embodiments of the present invention, including the compilation of HDL source code, the technology mapping and optimization as well as the partitioning, floor planning, replication, and splitting operations as described above. Thus, for example, the storage media 1053 may include a HDL compiler routine specified in computer program instructions. This HDL compiler routine 1061 will operate upon an HDL source code, such as the HDL source code stored in memory as file 1055 in order to produce the technology independent RTL list also stored in memory as netlist 1057. Optimization routines, such as optimization routines 1065 may also be stored on the machine readable media in order optimize the technology independent RTL netlist. Technology mapping routines 1063 are used to perform mapping operations from the technology independent netlist to a technology specific netlist as described above. Software routines which may perform various processes of the present invention are also stored in the machine readable media, including the partitioning routines 1067, the floor planning routines 1069, the replication routines 1071 and the splitting routines 1073.

The operations of the various methods of the present invention may be implemented by a processing unit in a digital processing system which executes sequences of computer program instructions which are stored in a memory which may be considered to be a machine readable storage media. The memory may be random access memory, read only memory, a persistent storage memory, such as mass storage device or any combination of these devices. Execution of the sequences of instruction causes the processing unit to perform operations according to the present invention. The instructions may be loaded into memory of the computer from a storage device or from one or more other digital processing systems (e.g. a server computer system) over a network connection. The instructions may be stored concurrently in several storage devices (e.g. DRAM and a hard disk, such as virtual memory). Consequently, the execution of these instructions may be performed directly by the processing unit. In other cases, the instructions may not be performed directly or they may not be directly executable by the processing unit. Under these circumstances, the executions may be executed by causing the processor to execute an interpreter that interprets the instructions, or by causing the processor to execute instructions which convert the received instructions to instructions which can be directly executed by the processor. In other embodiments, hard wired circuitry may be used in place of or in combination with software instructions to implement the present invention. Thus, the present invention is not limited to any specific combination of hardware circuitry and software, nor to any particular source for the instructions executed by the computer or digital processing system.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for designing an integrated circuit (IC), comprising:
    creating a hardware description language (HDL) code, said HDL code to functionally describe said IC;
    allocating a portion of an area of said IC to a specific portion of said HDL code; and
    selecting a portion of said HDL code designed for placement in one of said area of said IC and another area of said IC and replicating a logic resulting from said portion of said HDL code for placement on at least one of said area and said another area of said IC.

2. A method as in claim 1 wherein said allocating restricts circuitry created from said specific portion to said portion of said IC.

3. A method as in claim 2 wherein said IC comprises one of a programmable logic device or an Application Specific IC (ASIC).

4. A method as in claim 2 further comprising optimizing a design of said IC after said allocating.

5. A method as in claim 4 wherein said optimizing optimizes said IC by removing duplicative logic or duplicative inputs/outputs.

6. A method as in claim 4 wherein said optimizing includes using at least one interconnect delay between said area and said another area of said IC to improve said optimizing.

7. A method as in claim 2 further comprising optimizing a design of said IC before said allocating.

8. A method of claim 2 wherein said IC comprises a programmable logic device and wherein said method further comprises:
    testing a prototype of a system with said IC;
    performing a synthesis of said HDL code to generate at least one Application Specific Integrated Circuit (ASIC).

9. A method as in claim 2 further comprising partitioning said HDL code between representations of said IC and another IC.

10. A method as in claim 1 wherein said HDL code is created without regard to said allocating.

11. A method for designing an integrated circuit (IC), comprising:
    compiling a hardware description language (HDL) code to produce a technology independent register transfer level (RTL) netlist;
    mapping said RTL netlist to a target architecture to generate a technology specific netlist;
    allocating a portion of an area of said IC to a specific portion of said technology specific netlist; and
    selecting logic designed for placement in one of said area of said IC and another area of said IC and replicating said logic for placement on at least one of said area and said another area of said IC.

12. A method as in claim 11 wherein said allocating restricts circuitry created from said specific portion to said portion of said IC.

13. A method as in claim 12 wherein said IC comprises one of a programmable logic device or an Application Specific IC (ASIC).

14. A method as in claim 12 further comprising optimizing a design of said IC after said allocating.

15. A method as in claim 14 wherein said optimizing optimizes said IC by removing duplicative logic or duplicative inputs/outputs.

16. A method as in claim 14 wherein said optimizing includes using at least one interconnect delay between said area and said another area of said IC to improve said optimizing.

17. A method as in claim 12 further comprising optimizing a design of said IC before said allocating.

18. A method as in claim 12 wherein said IC comprises a programmable logic device and wherein said method further comprises:
testing a prototype of a system with said IC;
performing a synthesis of said HDL code to generate at least one Application Specific Integrated Circuit (ASIC).

19. A method as in claim 12 further comprising partitioning said RTL netlist between representations of said IC and another IC.

20. A method as in claim 11 wherein said HDL code is created without regard to said allocating.

21. A method for designing an integrated circuit (IC), comprising:
creating a description of said IC;
allocating a portion of an area of said IC to a specific portion of said description; and
selecting logic designed for placement in one of said area of said IC and another area of said IC and replicating said logic for placement on at least one of said area and said another area of said IC.

22. The method as in claim 21 wherein said description further comprises a hardware description language (HDL) code, said HDL code to functionally describe said IC.

23. The method as in claim 22 further comprising compiling said hardware description language (HDL) code to produce a technology independent register transfer level (RTL) netlist.

24. The method as in claim 23 further comprising mapping said RTL netlist to a target architecture to generate a technology specific netlist.

25. A method as in claim 21 wherein said allocating restricts circuitry created from said specific portion to said portion of said IC.

26. A method as in claim 25 wherein said IC comprises one of a programmable logic device or an Application Specific IC (ASIC).

27. A method as in claim 25 further comprising optimizing a design of said IC after said allocating.

28. A method as in claim 27 wherein said optimizing optimizes said IC by removing duplicative logic or duplicative inputs/outputs.

29. A method as in claim 27 wherein said optimizing includes using at least one interconnect delay between said area and said another area of said IC to improve said optimizing.

30. A method of claim 25, further comprising optimizing a design of said IC before said allocating.

31. A method as in claim 25 wherein said IC comprises a programmable logic device and wherein said method further comprises:
testing a prototype of a system with said IC;
performing a synthesis of said description to generate at least one Application Specific Integrated Circuit (ASIC).

32. A method as in claim 25 further comprising partitioning said description between representations of said IC and another IC.

33. A method as in claim 21 wherein said description is created without regard to said allocating.

34. A machine readable medium having stored thereon executable program code which, when executed, causes a machine to perform a method for designing an integrated circuit (IC), said method comprising:
creating a hardware description language (HDL) code, said HDL code to functionally describe said IC;
allocating a portion of an area of said IC to a specific portion of said HDL code; and
selecting a portion of said HDL code designed for placement in one of said area of said IC and another area of said IC and replicating a logic resulting from said portion of said HDL code for placement on at least one of said area and said another area of said IC.

35. A machine readable medium as in claim 34 wherein said allocating restricts circuitry created from said specific portion to said portion of said IC.

36. A machine readable medium as in claim 35 wherein said IC comprises one of a programmable logic device or an Application Specific IC (ASIC).

37. A machine readable medium as in claim 35, said method further comprising optimizing a design of said IC after said allocating.

38. A machine readable medium as in claim 37 wherein said optimizing optimizes said IC by removing duplicative logic or duplicative inputs/outputs.

39. A machine readable medium as in claim 37 wherein said optimizing includes using at least one interconnect delay between said area and said another area of said IC to improve said optimizing.

40. A machine readable medium as in claim 35, further comprising optimizing a design of said IC before said allocating.

41. A machine readable medium as in claim 35 wherein said IC comprises a programmable logic device and wherein said method further comprises:
testing a prototype of a system with said IC;
performing a synthesis of said HDL code to generate at least one Application Specific Integrated Circuit (ASIC).

42. A machine readable medium as in claim 35, said method further comprising partitioning said HDL code between representations of said IC and another IC.

43. A machine readable medium as in claim 34 wherein said HDL code is created without regard to said allocating.

44. A machine readable medium having stored thereon executable program code which, when executed, causes a machine to perform a method for designing an integrated circuit (IC), said method comprising:
compiling a hardware description language (HDL) code to produce a technology independent register transfer level (RTL) netlist;
mapping said RTL netlist to a target architecture to generate a technology specific netlist;
allocating a portion of an area of said IC to a specific portion of said technology specific netlist; and
selecting logic designed for placement in one of said area of said IC and another area of said IC and replicating said logic for placement on at least one of said area and said another area of said IC.

45. A machine readable medium as in claim 44 wherein said allocating restricts circuitry created from said specific portion to said portion of said IC.

46. A machine readable medium as in claim 45 wherein said IC comprises one of a programmable logic device or an Application Specific IC (ASIC).

47. A machine readable medium as in claim 45, said method further comprising optimizing a design of said IC after said allocating.

48. A machine readable medium as in claim 47 wherein said optimizing optimizes said IC by removing duplicative logic or duplicative inputs/outputs.

49. A machine readable medium as in claim 47 wherein said optimizing includes using at least one interconnect delay between said area and said another area of said IC to improve said optimizing.

50. A machine readable medium as in claim 45, further comprising optimizing a design of said IC before said allocating.

51. A machine readable medium as in claim 45 wherein said IC comprises a programmable logic device and wherein said method further comprises:
    testing a prototype of a system with said IC;
    performing a synthesis of said RDL code to generate at least one Application Specific Integrated Circuit (ASIC).

52. A machine readable medium as in claim 45, said method further comprising partitioning said RTL netlist between representations of said IC and another IC.

53. A machine readable medium as in claim 44 wherein said HDL code is created without regard to said allocating.

54. A machine readable medium having stored thereon executable program code which, when executed, causes a machine to perform a method for designing an integrated circuit (IC), said method comprising:
    creating a description of said IC;
    allocating a portion of an area of said IC to a specific portion of said description; and
    selecting logic designed for placement in one of said area of said IC and another area of said IC and replicating said logic for placement on at least one of said area and said another area of said IC.

55. The machine readable medium as in claim 54 wherein said description further comprises a hardware description language (HDL) code, said HDL code to functionally describe said IC.

56. The machine readable medium as in claim 55, wherein said method further comprising compiling said hardware description language (HDL) code to produce a technology independent register transfer level (RTL) netlist.

57. The machine readable medium as in claim 56, wherein said method further comprising mapping said RTL netlist to a target architecture to generate a technology specific netlist.

58. A machine readable medium as in claim 54 wherein said allocating restricts circuitry created from said specific portion to said portion of said IC.

59. A machine readable medium as in claim 58 wherein said IC comprises one of a programmable logic device or an Application Specific IC (ASIC).

60. A machine readable medium as in claim 58, said method further comprising optimizing a design of said IC after said allocating.

61. A machine readable medium as in claim 60 wherein said optimizing optimizes said IC by removing duplicative logic or duplicative inputs/outputs.

62. A machine readable medium as in claim 60 wherein said optimizing includes using at least one interconnect delay between said area and said another area of said IC to improve said optimizing.

63. A machine readable medium as in claim 58 further comprising optimizing a design of said IC before said allocating.

64. A machine readable medium as in claim 58 wherein said IC comprises a programmable logic device and wherein said method further comprises:
    testing a prototype of a system with said IC;
    performing a synthesis of said description to generate at least one Application Specific Integrated Circuit (ASIC).

65. A machine readable medium as in claim 58 wherein said method further comprising partitioning said description between representations of said IC and another IC.

66. A machine readable medium as in claim 54 wherein said description is created without regard to said allocating.

67. A digital processing system for use in designing an integrated circuit (IC), said digital processing system comprising:
    a display device;
    a memory;
    a processor coupled to said memory and said display device, said processor:
        creating a hardware description language (HDL) code, said HDL code to functionally describe said IC;
        allocating a portion of an area of said IC to a specific portion of said HDL code; and
        selecting a portion of said HDL code designed for placement in one of said area of said IC and another area of said IC and replicating a logic resulting from said portion of said HDL code for placement on at least one of said area and said another area of said IC.

68. A digital processing system as in claim 67 wherein said allocating restricts circuitry created from said specific portion to said portion of said IC.

69. A digital processing system as in claim 68 wherein said IC comprises one of a programmable logic device or an Application Specific IC (ASIC).

70. A digital processing system as in claim 68, wherein said processor further optimizing a design of said IC after said allocating.

71. A digital processing system as in claim 70 wherein said optimizing optimizes said IC by removing duplicative logic or duplicative inputs/outputs.

72. A digital processing system as in claim 70 wherein said optimizing includes using at least one interconnect delay between said area and said another area of said IC to improve said optimizing.

73. A digital processing system as in claim 68 wherein said processor further optimizing a design of said IC before said allocating.

74. A digital processing system as in claim 68 wherein said IC comprises a programmable logic device and said processor further:
    testing a prototype of a system with said IC;
    performing a synthesis of said HDL code to generate at least one Application Specific Integrated Circuit (ASIC).

75. A digital processing system as in claim 68, wherein said processor further partitioning said HDL code between representations of said IC and another IC.

76. A digital processing system as in claim 67 wherein said HDL code is created without regard to said allocating.

77. A digital processing system for use in designing an integrated circuit (IC), said digital processing system comprising:
  a display device;
  a memory;
  a processor coupled to said memory and said display device, said processor:
    compiling a hardware description language (HDL) code to produce a technology independent register transfer level (RTL) netlist;
    mapping said RTL netlist to a target architecture to generate a technology specific netlist;
    allocating a portion of an area of said IC to a specific portion of said technology specific netlist; and
    selecting logic designed for placement in one of said area of said IC and another area of said IC and replicating said logic for placement on at least one of said area and said another area of said IC.

78. A digital processing system as in claim 77 wherein said allocating restricts circuitry created from said specific portion to said portion of said IC.

79. A digital processing system as in claim 78 wherein said IC comprises one of a programmable logic device or an Application Specific IC (ASIC).

80. A digital processing system as in claim 78, wherein said processor further optimizing a design of said IC after said allocating.

81. A digital processing system as in claim 80 wherein said optimizing optimizes said IC by removing duplicative logic or duplicative inputs/outputs.

82. A digital processing system as in claim 80 wherein said optimizing includes using at least one interconnect delay between said area and said another area of said IC to improve said optimizing.

83. A digital processing system as in claim 78, wherein said processor further optimizing a design of said IC before said allocating.

84. A digital processing system as in claim 78 wherein said IC comprises a programmable logic device and said processor further:
  testing a prototype of a system with said IC;
  performing a synthesis of said HDL code to generate at least one Application Specific Integrated Circuit (ASIC).

85. A digital processing system as in claim 78, wherein said processor further partitioning said RTL netlist between representations of said IC and another IC.

86. A digital processing system as in claim 77 wherein said HDL code is created without regard to said allocating.

87. A digital processing system for use in designing an integrated circuit (IC), said digital processing system comprising:
  a display device;
  a memory;
  a processor coupled to said memory and said display device, said processor:
    creating a description of said IC;
    allocating a portion of an area of said IC to a specific portion of said description; and
    selecting logic designed for placement in one of said area of said IC and another area of said IC and replicating said logic for placement on at least one of said area and said another area of said IC.

88. The digital processing system as in claim 87 wherein said description further comprises a hardware description language (HDL) code, said HDL code to functionally describe said IC.

89. The digital processing system as in claim 88, wherein said processor further compiling said hardware description language (HDL) code to produce a technology independent register transfer level (RTL) netlist.

90. The digital processing system as in claim 89, wherein said processor further mapping said RTL netlist to a target architecture to generate a technology specific netlist.

91. A digital processing system as in claim 87 wherein said allocating restricts circuitry created from said specific portion to said portion of said IC.

92. A digital processing system as in claim 91 wherein said IC comprises one of a programmable logic device or an Application Specific IC (ASIC).

93. A digital processing system as in claim 91, wherein said processor further optimizing a design of said IC after said allocating.

94. A digital processing system as in claim 93 wherein said optimizing optimizes said IC by removing duplicative logic or duplicative inputs/outputs.

95. A digital processing system as in claim 94 wherein said IC comprises a programmable logic device and said processor further:
  testing a prototype of a system with said IC;
  performing a synthesis of said description to generate at least one Application Specific Integrated Circuit (ASIC).

96. A digital processing system as in claim 94, wherein said processor further partitioning said description between representations of said IC and another IC.

97. A digital processing system as in claim 93 wherein said optimizing includes using at least one interconnect delay between said area and said another area of said IC to improve said optimizing.

98. A digital processing system as in claim 91 wherein said processor further optimizing a design of said IC before said allocating.

99. A digital processing system as in claim 87 wherein said description is created without regard to said allocating.

* * * * *